(12) United States Patent
Yoshimura et al.

(10) Patent No.: US 10,011,768 B2
(45) Date of Patent: Jul. 3, 2018

(54) PHOSPHOR, LIGHT-EMITTING DEVICE, ILLUMINATION DEVICE AND IMAGE DISPLAY DEVICE

(71) Applicants: MITSUBISHI CHEMICAL CORPORATION, Chiyoda-ku (JP); TOHOKU UNIVERSITY, Sendai-shi (JP)

(72) Inventors: Fumitaka Yoshimura, Yokohama (JP); Hisanori Yamane, Sendai (JP)

(73) Assignees: MITSUBISHI CHEMICAL CORPORATION, Chiyoda-ku (JP); TOHOKU UNIVERSITY, Sendai-shi (JP)

( * ) Notice: Subject to any disclaimer, the term of this patent is extended or adjusted under 35 U.S.C. 154(b) by 0 days.

(21) Appl. No.: 15/474,462

(22) Filed: Mar. 30, 2017

(65) Prior Publication Data

US 2017/0204328 A1      Jul. 20, 2017

Related U.S. Application Data

(63) Continuation of application No. PCT/JP2015/079885, filed on Oct. 22, 2015.

(30) Foreign Application Priority Data

Oct. 23, 2014   (JP) .................................. 2014-216719

(51) Int. Cl.
 *C09K 11/77* (2006.01)
 *C09K 11/08* (2006.01)
 *H01L 33/50* (2010.01)

(52) U.S. Cl.
 CPC ...... *C09K 11/7734* (2013.01); *C09K 11/0883* (2013.01); *H01L 33/502* (2013.01)

(58) Field of Classification Search
 None
 See application file for complete search history.

(56) References Cited

U.S. PATENT DOCUMENTS 8,894,884 B2   11/2014   Yoshimatsu
2003/0030368 A1   2/2003   Ellens et al.
(Continued)

FOREIGN PATENT DOCUMENTS

JP   2003-124527   4/2003
JP   2005-226000   8/2005
(Continued)

OTHER PUBLICATIONS

International Search Report dated Jan. 19, 2016 in PCT/JP2015/079885, filed on Oct. 22, 2015.
(Continued)

*Primary Examiner* — Michelle Mandala
(74) *Attorney, Agent, or Firm* — Oblon, McClelland, Maier & Neustadt, L.L.P.

(57) ABSTRACT

A phosphor comprising a crystalline phase having a composition expressed by Formula [1] below, a crystal system of the phosphor being a hexagonal crystal system, $$M_m A_a Al_b Si_c N_{40} \qquad [1]$$

(in Formula [1]
M denotes an activating element,
A denotes one or more types of elements selected from the group consisting of alkaline earth metal elements, and m, a, b and c denote values that satisfy expressions below independent from each other $0 < m \leq 0.2$ $1.2 \leq a \leq 5.6$ $2.4 \leq b \leq 11.2$ $18.8 \leq c \leq 27.6$).

8 Claims, 16 Drawing Sheets

(56) References Cited

U.S. PATENT DOCUMENTS

| | | | |
|---|---|---|---|
| 2007/0259206 A1* | 11/2007 | Oshio | C04B 35/581 428/690 |
| 2008/0150412 A1 | 6/2008 | Yoshimatsu | |
| 2009/0033201 A1 | 2/2009 | Shimooka et al. | |
| 2009/0134775 A1 | 5/2009 | Watanabe et al. | |
| 2009/0309112 A1 | 12/2009 | Yoshimatsu | |
| 2009/0322209 A1* | 12/2009 | Becker | C09K 11/7734 313/503 |
| 2010/0164367 A1 | 7/2010 | Shioi et al. | |
| 2013/0285104 A1* | 10/2013 | Yoshimura | C09K 11/0883 257/98 |
| 2014/0092600 A1* | 4/2014 | Fukuda | C09K 11/0883 362/293 |
| 2014/0125222 A1* | 5/2014 | Hikmet | C09K 11/06 313/504 |
| 2015/0055322 A1 | 2/2015 | Yoshimatsu | |

FOREIGN PATENT DOCUMENTS

| | | |
|---|---|---|
| JP | 2006-137902 | 6/2006 |
| JP | 2006-306982 | 11/2006 |
| JP | 2007-169428 | 7/2007 |
| JP | 2007-291352 | 11/2007 |
| JP | 2008-138156 | 6/2008 |
| JP | 2008-150549 | 7/2008 |
| JP | 2009-256558 | 11/2009 |
| JP | 2010-163555 | 7/2010 |

OTHER PUBLICATIONS

International Preliminary Report on Patentability and Written Opinion dated May 4, 2017 in PCT/JP2015/079885 (English translation only).

* cited by examiner

PHOSPHOR, LIGHT-EMITTING DEVICE, ILLUMINATION DEVICE AND IMAGE DISPLAY DEVICE

CROSS-REFERENCE TO RELATED APPLICATION

This is a continuation of International Application PCT/JP2015/079885 filed on Oct. 22, 2015, and designated the United States, and claims priority from Japanese Patent Application 2014-216719 filed on Oct. 23, 2014, the entire contents of which are incorporated herein by reference.

TECHNICAL FIELD

The present invention relates to a phosphor, a light-emitting device, an illumination device, and an image display device.

BACKGROUND ART

In response to trends in energy conservation, demands for illumination or backlight using an LED are increasing recently. The LED used therein is a white light-emitting LED in which phosphor is disposed on an LED chip which emits blue or near-ultraviolet wavelength light. For this type of white light-emitting LED, the one in which a phosphor, which emits yellow or orange light using the blue light from the blue LED chip as an excitation light, is provided on a blue LED chip, is recently being used. An even better emission efficiency is demanded for an LED, and a phosphor which excels in emission characteristics is desired for a yellow or orange phosphor.

A YAG (yttrium aluminum garnet) phosphor is known as a yellow phosphor, and Patent Literature 1, for example, discloses that emission characteristics of a YAG phosphor are improved by using flux.

As another yellow or orange phosphor, Patent Literature 2, for example, discloses an α-sialon phosphor, which is expressed by compositional formula $Sr_{1.11}Al_{2.25}Si_{9.75}N_{16}$:$Eu_{0.02}$.

CITATION LIST

Patent Literatures

Patent Literature 1: Japanese Patent Application Laid-open No. 2010-163555
Patent Literature 2: Japanese Patent Application Laid-open No. 2009-256558

SUMMARY OF INVENTION

Technical Problem

As mentioned above, various yellow or orange phosphors have been developed, but yellow or orange phosphors having even better emission characteristics are demanded.

With the foregoing in view, it is an object of the present invention to provide a new yellow or orange phosphor which is useful in white light-emitting LED applications.

Another object of the present invention is to provide a light-emitting device which includes a new yellow or orange phosphor, and an illumination device and an image display device which include this light-emitting device.

Solution to Problem

With the foregoing in view, the present inventors performed earnest examinations in seeking new phosphors, and discovered a new yellow or orange phosphor which can be effectively used in LED applications, whereby the present invention was completed.

The present invention is provided below.

<1> A phosphor comprising a crystalline phase having a composition expressed by Formula [1] below, a crystal system of the phosphor being a hexagonal crystal system, $$M_m A_a Al_b Si_c N_{40} \quad [1]$$

(in Formula [1]
M denotes an activating element,
A denotes one or more types of elements selected from the group consisting of alkaline earth metal elements, and
m, a, b and c denote values that satisfy expressions below independent from each other $0 < m \leq 0.2$ $1.2 \leq a \leq 5.6$ $2.4 \leq b \leq 11.2$ $18.8 \leq c \leq 27.6$).

<2> A phosphor comprising a crystalline phase including elements M, A, Al, Si and N, a space group of the phosphor being P-6
(where M denotes an activating element, and
A denotes one or more types of elements selected from the group consisting of alkaline earth metal elements).
<3> The phosphor according to <1> or <2>, wherein A includes Ca and/or Sr.
<4> The phosphor according to any one of <1> to <3>, wherein M includes Eu.
<5> The phosphor according to any one of <1> to <4>, wherein the phosphor has an emission peak wavelength in a range of 560 nm or more and 620 nm or less when irradiated with an excitation light having a wavelength of 350 nm or more and 450 nm or less.
<6> A light-emitting device, comprising a first illuminant, and a second illuminant that emits visible light when irradiated with light from the first illuminant, wherein the second illuminant includes the phosphor according to any one of <1> to <5>.
<7> An illumination device comprising the light-emitting device according to <6> as a light source.
<8> An image display device comprising the light-emitting device according to <6> as a light source.

Advantageous Effects of Invention

The yellow or orange phosphor of the present invention has a crystal structure, which is different from conventional phosphors, and can see effective use in a white light-emitting LED applications.

The light-emitting device, including the new yellow or orange phosphor of the present invention, and the illumination device and the image display device, including this light-emitting device, are high quality.

DESCRIPTION OF EMBODIMENTS

Figure 1:
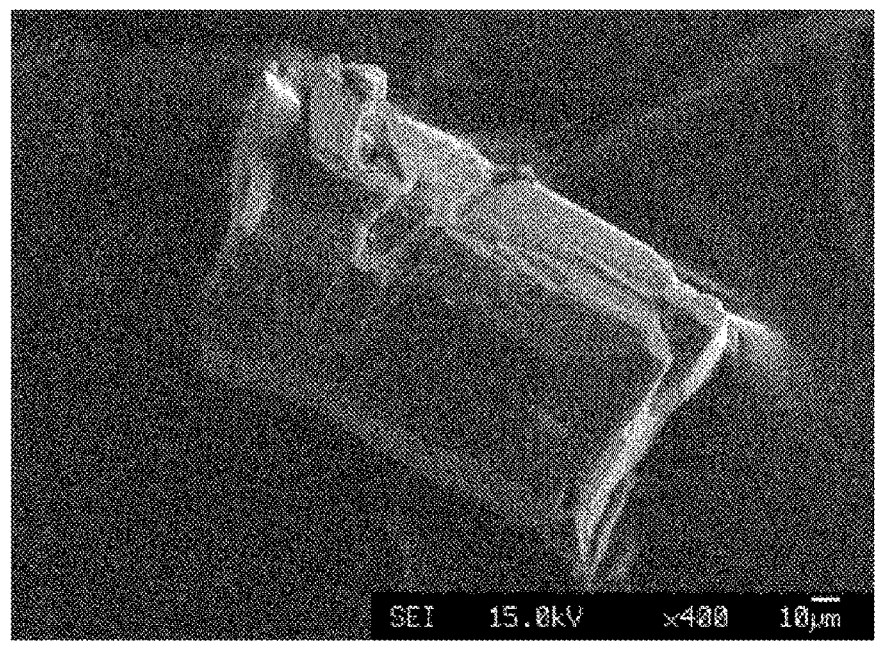
FIG. 1 is an image of a phosphor acquired in Example 1, captured by a scanning electron microscope (drawing-substituting photo)

Embodiments and examples of the present invention will now be described, but the present invention is not limited to the following embodiments and examples, and may be modified freely within a scope that does not depart from the spirit of the invention.

In this description, the numeric range expressed using "to" is a range including the numeric values before and after "to" as the lower limit value and the upper limit value.

Each composition formula of the phosphors in this Description is punctuated by a comma (,). Enumerations of a plurality of elements separated by commas (,) denote that one, two or more of the listed elements may be present in arbitrary combinations and compositions. For example, a composition formula, "(Ca,Sr,Ba)Al$_2$O$_4$:Eu", inclusively indicates all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu" and "Ca$_{1-x-y}$Sr$_x$Ba$_y$Al$_2$O$_4$:Eu" (here, in these formulae, $0<x<1$, $0<y<1$, $0<x+y<1$).

The present invention includes a first aspect and a second aspect.

1. First Aspect of Invention

A first aspect of the present invention includes a phosphor (Embodiment 1), a light-emitting device (Embodiment 2), an illumination device (Embodiment 3) and an image display device (Embodiment 4). The first aspect of the present invention is also a preferred mode of the second aspect of the present invention, which will be described later.

1-1. Embodiment 1 of First Aspect of Invention: Phosphor

<Phosphor>
[Description of Formula [1]]

The phosphor according to Embodiment 1 of the first aspect of the present invention comprises a crystalline phase having a composition expressed by Formula [1] below, a crystal system of the phosphor being a hexagonal crystal system.

$$M_m A_a Al_b Si_c N_{40} \qquad [1]$$

(in Formula [1]

M denotes an activating element,

A denotes one or more types of elements selected from the group consisting of alkaline earth metal elements, and m, a, b and c denote values that satisfy expressions below independent from each other $0<m\leq0.2$ $1.2\leq a\leq5.6$ $2.4\leq b\leq11.2$

).

In Formula [1], the activating element M is one type or two or more types of elements selected from europium (Eu), manganese (Mn), cerium (Ce), praseodymium (Pr), neodymium (Nd), samarium (Sm), terbium (Tb), dysprosium (Dy), holmium (Ho), erbium (Er), thulium (Tm) and ytterbium (Yb). M preferably includes Eu at the least, and is preferably Eu.

Further, a part of or all of Eu may be substituted by at least one type of element selected from the group consisting of Ce, Pr, Sm, Tb and Yb, and Ce is preferable in terms of luminous quantum efficiency.

In other words, M is more preferably Eu and/or Ce, and even more preferably Eu.

The ratio of Eu, with respect to all activating elements, is preferably 50 mol % or more, more preferably 70 mol % or more, and even more preferably 90 mol % or more.

In Formula [1], A denotes one or more types of elements selected from the group consisting of alkaline earth metal elements. Alkaline earth metal elements are, for example, strontium (Sr), magnesium (Mg), calcium (Ca) and barium (Ba).

A preferably includes at least Ca and/or Sr, more preferably A includes Sr, and even more preferably A is Sr.

A may be partially substituted by a bi-valent metallic element, such as zinc (Zn), other than the alkaline earth metal elements.

In Formula [1], Al denotes aluminum. Al may be partially substituted by another tri-valent element, such as boron (B), gallium (Ga), indium (In), scandium (Sc), yttrium (Y), lanthanum (La), gadolinium (Gd) and lutetium (Lu).

In Formula [1], Si denotes silicon. Si may be partially substituted by another quadrivalent element, such as germanium (Ge), tin (Sn), titanium (Ti), zirconium (Zr) and hafnium (Hf).

The phosphor according to this embodiment may contain oxygen and halogen atoms, besides the above mentioned constituent elements of the phosphor.

Oxygen may be mixed in as an impurity in the metallic raw material, or may be introduced during such manufacturing processes as the crushing step and the nitrization step, which cannot be avoided for the phosphor of this embodiment.

Halogen atoms may be mixed in as an impurity in the metallic raw material, or may be introduced during such manufacturing processes as the crushing step and nitrization step, and is especially possible to be contained in the phosphor when halide is used as the flux.

m denotes the content of the activating element M, and the range thereof is normally $0<m\leq0.2$. The lower limit value is preferably 0.001, and is more preferably 0.02, and the upper limit value is preferably 0.15, and is more preferably 0.1, and even more preferably 0.08.

a denotes the content of the element A, and the range thereof is normally $1.2\leq a\leq5.6$. The lower limit value is preferably 1.6, and is more preferably 2.0, and the upper limit value is preferably 4.8, and is more preferably 4.0.

b denotes the content of Al, and the range thereof is normally $2.4\leq b\leq11.2$. The lower limit value is preferably 3.2, and is more preferably 4.0, and the upper limit value is preferably 9.6, and is more preferably 8.0.

In the phosphor according to this embodiment, the elements A in the crystal structure need not completely occupy the site, therefore the occupancy rate of the elements A is higher than the normal variance of the composition caused by defects. Here, the crystals must maintain electrical neutrality, therefore the Al occupancy rate changes as the Si occupancy rate changes. Because of this, the Al occupancy rate probably becomes higher than the normal variance of the composition caused by defects.

c denotes the content of Si, and the range thereof is normally $18.8\leq c\leq27.6$. The lower limit value is preferably 20.4, and is more preferably 22.0, and the upper limit value is preferably 26.8, and is more preferably 26.0.

It is preferably that both content values are in the above mentioned range, in terms of the emission characteristics of the obtained phosphor, and particularly in terms of the emission brightness.

<Physical Property of Phosphor>

[Emission Colors]

By adjusting the chemical composition and the like, the phosphor of this embodiment can be excited by light in the near-ultraviolet region to the blue region (wavelength 300 nm to 500 nm), and can emit desired colors, such as blue, greenish blue, green, yellowish green, yellow, orange and red.

[Emission Spectrum]

It is preferable that the phosphor of this embodiment has the following characteristics when the phosphor is excited by light having a 400 nm wavelength and the emission spectrum is measured.

In the phosphor of this embodiment, the peak wavelength in the above mentioned emission spectrum is normally 560 nm or more, preferably 570 nm or more, and more preferably 580 nm or more. The peak wavelength is also normally 620 nm or less, preferably 610 nm or less, and more preferably 600 nm or less.

If the peak wavelength is in this range, a good yellow to orange color is emitted from the acquired phosphor, which is desirable.

[Half-Bandwidth of Emission Spectrum]

In the phosphor of this embodiment, the half-bandwidth of the emission peak in the above mentioned emission spectrum is normally 110 nm or less, preferably 100 nm or less, more preferably 95 nm or less, and also normally 30 nm or more.

If the half-bandwidth is in this range when this phosphor is used for a liquid crystal display device or the like, color reproduction range of the image display device becomes wider without dropping color purity, which is desirable.

To excite the phosphor of this embodiment by light having a 400 nm wavelength, a GaN type LED can be used, for example. To measure the emission spectrum of the phosphor of this embodiment, and to calculate the emission peak wavelength, the relative intensity, and the half-bandwidth of the peak, a 150 W xenon lamp can be used as the excitation light source, and a fluoro-photometer (made by JASCO Corporation) which includes a multi-channel CCD detector (made by Hamamatsu Photonics K.K.), can be used as the spectrum measurement apparatus.

[Temperature Characteristics (Emission Intensity Maintenance Rate)]

The phosphor of this embodiment also excels in temperature characteristics. In concrete terms, the ratio of the emission peak intensity value in the emission spectrum at 200° C. with respect to the emission peak intensity value in the emission spectrum at 25° C., when a light having a 450 nm wavelength is irradiated, is normally 50% or more, preferably 60% or more, and more preferably 70% or more.

This ratio will unlikely exceed 100% in the case of a conventional phosphor, since the emission intensity drops as the temperature rises, but may exceed 100% in the case of the phosphor of this embodiment, due to unspecified reasons. However, if 100% is exceeded, a color shift tends to occur because of the temperature change.

To measure this temperature characteristic, a conventional method can be used, such as a method disclosed in Japanese Patent Application Laid-open No. 2008-138156.

[Excitation Wavelength]

The phosphor of this embodiment has an excitation peak in a wavelength range that is normally 300 nm or more, preferably 350 nm or more, and more preferably 400 nm or more, and that is normally 500 nm or less, preferably 480 nm or less, more preferably 460 nm or less, and even more preferably 450 nm or less. In other words, this phosphor is excited by light in a near-ultraviolet to blue region.

[CIE Chromaticity Coordinates]

The x value of the CIE chromaticity coordinates of the phosphor of this embodiment is normally 0.450 or more, preferably 0.475 or more, more preferably 0.500 or more, even more preferably 0.520 or more, and ideally 0.540 or more, and is normally 0.660 or less, preferably 0.640 or less, and more preferably 0.620 or less. The y value of the CIE chromaticity coordinates of the phosphor of this embodiment is normally 0.360 or more, and preferably 0.380 or more, and is normally 0.500 or less, preferably 0.480 or less, and more preferably 0.460 or less.

If the CIE chromaticity coordinates are in the above mentioned ranges, a light-emitting device, which emits colors with high color rendering properties, preferably white to light bulb color, when combined with a blue LED, is acquired.

(Quantum Efficiency)

The external quantum efficiency ($\eta_o$) of the phosphor of this embodiment is normally 40% or more, preferably 45% or more, more preferably 50% or more, and even more preferably 55% or more. The higher the external quantum efficiency the better since emission efficiency improves.

The internal quantum efficiency ($\eta_i$) of the phosphor of this embodiment is normally 60% or more, preferably 65% or more, more preferably 70% or more, even more preferably 75% or more, and ideally 80% or more. The internal quantum efficiency refers to a ratio of an emitted photon number with respect to a photon number of the excitation light absorbed by the phosphor. Therefore the higher the internal quantum efficiency the better since the emission efficiency and the emission intensity improve.

[Lattice Constants]

The lattice constants of the phosphor of this embodiment is as follows.

The lattice constant of the a axis is normally 7.11 Å or more, preferably 7.55 Å or more, and more preferably 7.87 Å or more, and is normally 8.35 Å or less, preferably 8.19 Å or less, and more preferably 8.03 Å or less.

As mentioned later, the crystal system of the phosphor of this embodiment is a hexagonal crystal system. Therefore, the lattice constant of the b axis has the same range as the a axis. Preferable values thereof are also the same as the a axis.

The lattice constant of the c axis is normally 13.67 Å or more, preferably 13.96 Å or more, and more preferably 14.25 Å, and is normally 15.11 Å or less, preferably 14.82 Å or less, and more preferably 14.54 Å or less.

[Unit Lattice Volume]

The unit lattice volume (V) of the phosphor of this embodiment, calculated from the lattice constant, is preferably 709.36 $Å^3$ or more, more preferably 748.77 $Å^3$ or more, and even more preferably 768.47 Å, and preferably 866.99 $Å^3$ or less, more preferably 827.59 $Å^3$ or less, and even more preferably 807.88 $Å^3$ or less.

If the unit lattice value is too large or too small, the skeletal structure of the lattice becomes unstable, and impurities having a different structure may be generated as a byproduct, which may drop the emission intensity and the color purity.

[Crystal System and Space Group]

The crystal system of the phosphor of this embodiment is hexagonal.

The space group of the phosphor of this embodiment is not especially limited if the average structure indicates the above mentioned length of cycle period, but preferably belongs to No. 168 (P6) or No. 174 (P-6) based on "International Tables for Crystallography (Third revised edition), Volume A, SPACE-GROUP SYMMETRY", and more preferably belongs to P-6.

Here the lattice constant and the space group may be determined by a conventional method. The lattice constant can be determined by performing Rietveld analysis on the X-ray diffraction or the neutron beam diffraction result, and the space group can be determined by electron beam diffraction.

In this crystal structure, the activating element M is substitutionally dissolved into the Sr site.

[Powder X-Ray Diffraction (XRD) Pattern]

The phosphor of this embodiment has peaks in the following regions 1 to 5 in the powder X-ray diffraction pattern measured using the CuKα ray (1.5418 Å).

The phosphor has at least two peaks in region 3, and one has the highest peak intensity in the powder X-ray diffraction pattern. This peak intensity is defined as the maximum peak intensity: $I_{max}$. Here a peak intensity is a value acquired by performing background correction.

Region 1 12.23°≤2θ≤13.52°
Region 2 27.32°≤2θ≤30.00°
Region 3 30.07°≤2θ≤35.53°
Region 4 35.58°≤2θ≤38.00°
Region 5 38.03°≤2θ≤41.37°

In this embodiment, "having a peak in each region 1 to 5" means that the peak top is in the range of each region 1 to 5. In this embodiment, regions 1 to 5 are specified only to select the peaks that are characteristic to the phosphor of this embodiment. In the phosphor of this embodiment, the peaks which can be confirmed in the X-ray diffraction pattern and the peaks which cannot be confirmed in the X-ray diffraction pattern may be generated due to the orientation of the crystals depending on the shape of the crystal, which occurs during measurement. The peaks that appear in regions 2, 4 and 5 in this embodiment are peaks that can be characteristically confirmed even if the orientation occurs.

In the phosphor of this embodiment, the crystal structure, which is identified by such a diffraction method as the X-ray diffraction or the neutron beam diffraction, may include an irregular structure, such as a stacking fault generated in the cycle and sequence of stacking the layers in a crystal structure, and may have a local portion where the structure is imperfect.

Whether this stacking fault or the like is present or not can be confirmed in single crystal structure analysis by checking for streaks in the X-ray diffraction pattern image, or in TEM observation, for example. If the crystal structure has such a local irregular structure, an average structure that can be statistically estimated in a range that can be distinguished in X-ray diffraction exhibits as a periodic cycle.

It is not especially critical whether a local irregular structure is present or not in the crystal structure, but it is preferable that the structure has a local irregular structure, and the structure is averaged. This is because a compositional deviation caused by elemental volatilization during baking or the like can be suppressed and equalized because of the presence of the local irregular structure in the crystal structure. Therefore the phase purity of the phosphor of this embodiment increases, and the generation of a byproduct of another structure can be suppressed, and as a result, the emission intensity improves and the temperature characteristics also improve.

The peak intensity ($I_1$) of at least one of the peaks in region 1 has a ratio ($I_1/I_{max}$) with respect to the maximum peak intensity ($I_{max}$) that is normally 0.02 or more, preferably 0.04 or more, and more preferably 0.06 or more.

The peak intensity ($I_2$) of at least one of the peaks in region 2 has a ratio ($I_2/I_{max}$) with respect to the maximum peak intensity ($I_{max}$) that is normally 0.23 or more, preferably 0.39 or more, and more preferably 0.62 or more.

The peak intensity ($I_3$) of at least one of the peaks in region 3, excluding the maximum peak intensity ($I_{max}$), has a ratio ($I_3/I_{max}$) with respect to the maximum peak intensity ($I_{max}$), that is normally 0.6 or more, preferably 0.7 or more, and more preferably 0.8 or more.

The peak intensity ($I_4$) of at least one of the peaks in region 4 has a ratio ($I_4/I_{max}$) with respect to the maximum peak intensity ($I_{max}$) that is normally 0.12 or more, preferably 0.2 or more, and more preferably 0.32 or more.

The peak intensity ($I_5$) of at least one of the peaks in region 4 has a ratio ($I_5/I_{max}$) with respect to the maximum peak intensity ($I_{max}$) that is normally 0.14 or more, preferably 0.23 or more, and more preferably 0.37 or more.

<Phosphor Manufacturing Method>

The raw materials and the phosphor manufacturing method to acquire the phosphor of this embodiment are as follows.

The method for manufacturing the phosphor of this embodiment is not especially limited, but, for example, a material of element M, which is an activating element (hereafter may be called "M source"), a material of A (hereafter may be called "A source"), a material of Al (hereafter may be called "Al source"), and a material of Si (hereafter may be called "Si source") are mixed (mixing step), and the acquired mixture is baked (baking step).

In the following description, a material of the element Eu may be called the "Eu source", and a material of the element Sm may be called the "Sm source", for example.

[Phosphor Materials]

(M Source)

Examples of the Eu source in the M source include: $Eu_2O_3$, $Eu_2(SO_4)_3$, $Eu_2(C_2O_4)_3 \cdot 10H_2O$, $EuCl_2$, $EuCl_3$, $Eu(NO_3)_3 \cdot 6H_2O$, EuN and EuNH. Of these, $Eu_2O_3$, EuN and the like are preferable, and EuN is particularly preferable.

Examples of materials of other activating elements, such as the Sm source, Tm source and Yb source, are the respective compounds listed as examples of an Eu source, in which the Eu is substituted by Sm, Tm, Yb or the like respectively.

(A Source)

Examples of the Sr source in the A source include: SrO, $Sr(OH)_2 \cdot 8H_2O$, $SrCO_3$, $Sr(NO_3)_2$, $SrSO_4$, $Sr(C_2O_4) \cdot H_2O$, $Sr(OCOCH_3)_2 \cdot 0.5H_2O$, $SrCl_2$, $Sr_3N_2$ and SrNH. Of these, SrO, $SrCO_3$, $Sr_2N$ and $Sr_3N_2$ are preferable, and $Sr_2N$ and $Sr_3N_2$ are particularly preferable. It is preferable that the particle size is small in terms of reactivity, and of which purity is high in terms of emission efficiency.

Examples of materials of other alkaline earth metal elements, such as the Mg source, Ca source and Ba source, are the respective compounds listed as examples of an Sr source, in which the Sr is substituted by Mg, Ca, Ba or the like respectively.

(Al Source)

Examples of the Al source include: AlN, $Al_2O_3$, $Al(OH)_3$, AlOOH and $Al(NO_3)_3$. Of these, AlN and $Al_2O_3$ are preferable, and AlN is particularly preferable. It is preferable that the particle size is small in terms of reactivity, and of which purity is high in terms of emission efficiency as AlN.

Examples of materials of the trivalent elements are respective compounds listed as examples of the Al source, in which Al is substituted by B, Ga, In, Sc, Y, La, Gd, Lu or the like respectively. Al alone may be used for the Al source.

(Si Source)

For examples of the Si source, $SiO_2$ or $Si_3N_4$ is preferable. A compound of $SiO_2$ may be used. Examples of such a compound are $SiO_2$, $H_4SiO_4$ and $Si(OCOCH_3)_4$. It is preferable that the particle size is small in terms of reactivity, and of which purity is high in terms of emission efficiency as $Si_3N_4$. Further, a compound of which content ratio of carbon elements, which are impurities, is low, is preferable.

Examples of materials of the quadrivalent elements are respective compounds listed as examples of the Si source, in which Si is substituted by Ge, Ti, Zr, Hf or the like respectively. Si alone may be used for the Si source.

For the above mentioned M source, A source, Al source and Si source, only one type may be used, or an arbitrary combination of two or more types may be used with an arbitrary combining ratio.

[Mixing Step]

The phosphor materials are weighed so that a target composition can be acquired, mixed well using a ball mill or the like, then this mixture is filled into a crucible and baked at a predetermined temperature in a predetermined atmosphere, and the baked product is then crushed and cleaned, whereby the phosphor of this embodiment can be acquired.

The mixing method is not especially limited, and may be either a dry mixing method or a wet mixing method.

An example of the dry mixing method is the ball mill.

An example of the wet mixing method is adding solvent or a dispersion medium, such as water, to the above mentioned phosphor material, mixing using a mortar and pestle so as to be a solution or slurry state, then drying this mixture by spray drying, heat drying, air drying or the like.

[Baking Step]

The acquired mixture is filled into a heat resistant container, such as a crucible or tray, made from a material of which reactivity with each phosphor material is low. The material of the heat resistant container used for this baking is not especially limited as long as the effect of this embodiment is not diminished, and a crucible constituted of boron nitride, for example, may be used.

The baking temperature differs depending on the pressure and other conditions, but normally is a temperature range of 1800° C. or more and 2150° C. or less. The highest temperature attained in the baking step is normally 1800° C. or more, preferably 1900° C. or more, and more preferably 2000° C. or more, and is normally 2150° C. or less, and preferably 2100° C. or less.

If the baking temperature is too high, nitrogen tends to scatter and generate defects in the host crystals, causing stains, and if the baking temperature is too low, the progress of the solid phase reaction tends to slow, and it may become difficult to acquire the target phase as the main phase.

The pressure in the baking step differs depending on the baking temperature and the like, but is normally 0.2 MPa or more, and preferably 0.4 MPa or more, and is normally 200 MPa or less, and preferably 190 MPa or less. In the case of preventing detects by suppressing the volatilization of constituent elements, particularly the alkaline earth metal elements, pressure is preferably 0.8 MPa or more, more preferably 10 MPa or more, even more preferably 50 MPa or more, even still more preferably 100 MPa or more, and ideally 150 MPa or more. To acquire a phosphor having high absorption efficiency, pressure is preferably 190 MPa or less, more preferably 50 MPa or less, even more preferably 10 MPa or less, and ideally 1.0 MPa or less.

When the pressure in the baking step is 10 MPa or less, the highest temperature attained during baking is normally 1800° C. or more, preferably 1900° C. or more, and more preferably 2000° C. or more, and is normally 2150° C. or less, and preferably 2100° C. or less.

If the baking temperature is less than 1900° C., the solid phase reaction does not progress, and hence only the impurity phase or non-reaction phase may be acquired, and it may become difficult to acquire the target phase as the main phase.

Even if very few target crystal phases are acquired, the quantum efficiency may drop since the main elements to generate light emission in the crystals, particularly the Eu elements, may not be diffused, and the quantum efficiency may drop thereby. If the baking temperature is too high, elements constituting the target phosphor crystals become more easily volatilized, which generate lattice defects, or these elements may decompose and generate a different phase as impurities.

The baking atmosphere in the baking step is arbitrary, as long as phosphor of this embodiment is acquired, but a nitrogen-containing atmosphere is preferable. In concrete terms, a nitrogen atmosphere, a hydrogen-containing nitrogen atmosphere or the like can be used, but a nitrogen atmosphere is particularly preferable. The oxygen content in the baking atmosphere is normally 10 ppm or less, preferably 5 ppm or less.

The baking time differs depending on the temperature, the pressure and the like during baking, but is normally 10 minutes or more, and preferably 30 minutes or more, and is normally 72 hours or less, and preferably 12 hours or less. If the baking time is too short, grain generation and grain growth cannot be induced, and hence a phosphor having good characteristics cannot be acquired. If the baking time is too long, volatilization of constituting elements is induced, hence defects may be generated in the crystal structure due to the loss of atoms, and a phosphor having good characteristics cannot be acquired.

[Post Processing Step]

The acquired baked products have the composition of grains or blocks. These baked products are cracked, crushed and/or classified so as to be powder of a predetermined particle size. Here this processing is performed such that D50 becomes about 30 µm or less.

An example of this processing is a method of classifying this compound using a sieve of which aperture is about 45 µm, providing the sieved-powder for the next step, or a method of milling the compound to a predetermined grain size using a standard mill, such as a ball mill, a vibrating mill or a jet mill. In the latter method, excessive milling not only generates particles which easily scatter light, but also generates crystal defects on the surface of particles, which may drop the emission efficiency.

If necessary, a step of cleaning the phosphors (baked products) may be included. After the cleaning step, the phosphors are dried until no adhering moisture exists, then the phosphors are used. Further, if necessary, dispersion/classification processing may be performed to loosen clumping.

The phosphors of this embodiment may be generated by an alloying method, which alloys the composing metal elements in advance, and nitrides the alloy.

<One Embodiment of First Aspect of Invention: Phosphor-Containing Composition>

The phosphor according to Embodiment 1 of the first aspect of the present invention may be used by mixing with a liquid medium. Particularly when the phosphor according to Embodiment 1 of the first aspect of the present invention is used for such an application as a light-emitting device, it is preferable to use the phosphor in a state dispersed in a liquid medium. The phosphor according to Embodiment 1 of the first aspect of the present invention that is dispersed in a liquid medium may be called "phosphor-containing composition according to one embodiment of the first aspect of the present invention" as one embodiment of the first aspect of the present invention.

[Phosphor]

The type of the phosphor generated according to Embodiment 1 of the first aspect of the present invention, which is contained in the phosphor-containing composition of this embodiment, is not especially limited, and may be freely selected from the above mentioned types. Further, only one type of phosphor, generated according to Embodiment 1 of the first aspect of the present invention, may be contained in the phosphor-containing composition of this embodiment, or two or more types may be combined arbitrarily at an arbitrary ratio. Furthermore, the phosphor-containing composition of this embodiment may contain a phosphor other than the phosphor according to Embodiment 1 of the first aspect of the present invention, as long as the effect of this embodiment is not considerably diminished.

[Liquid Medium]

The liquid medium used for the phosphor-containing composition of this embodiment is not especially limited, as long as the performance of this phosphor is not diminished in the target range. For example, any organic material and/or inorganic material may be used if the material is liquid under desired operating conditions, and appropriately disperses the phosphor according to Embodiment 1 of the first aspect of the present invention, and does not cause an undesirable reaction with the phosphor, and, for example, silicon resin, epoxy resin or polyimide silicon resin can be used.

[Content Ratios of Liquid Medium and Phosphor]

The content ratios of the phosphor and the liquid medium to the phosphor-containing composition of this embodiment are arbitrary as long as the effect of this embodiment is not considerably diminished, but the content ratio of the liquid medium with respect to the total phosphor-containing composition of this embodiment is normally 50 weight % or more, and preferably 75 weight % or more, and is normally 99 weight % or less, and preferably 95 weight % or less.

[Other Components]

Components other than the phosphor and liquid medium may be contained in the phosphor-containing composition of this embodiment, as long as the effect of this embodiment is not considerably diminished. For other components, only one type of component may be used, or two or more types of components may be arbitrarily combined at an arbitrary ratio.

1-2. Embodiment 2 of the First Aspect of Invention: Light-Emitting Device

Embodiment 2 of the first aspect of the present invention is a light-emitting device which includes a first illuminant (excitation light source) and a second illuminant which emits visible light when irradiated with light from the first illuminant, and contains, as the second illuminant, the phosphor according to Embodiment 1 of the first aspect of the present invention. For the phosphor according to Embodiment 1 of the first aspect of the present invention, any one type may be used alone, or two or more types may be arbitrarily combined at an arbitrary ratio, and used together.

For the phosphor according to this embodiment, for example, a phosphor that emits fluorescence in the yellow or orange range when irradiated with light from the excitation light source is used. In concrete terms, to constitute the light-emitting device, it is preferable that the yellow or orange phosphor has an emission peak in the 560 nm to 620 nm wavelength range.

For the excitation source, the light having the emission peak in a wavelength range less than 420 nm may be used.

Here a light-emitting device, where the phosphor according to Embodiment 1 of the first aspect of the present invention has an emission peak in the wavelength range of 560 nm or more and 620 nm or less, and the first phosphor has an emission peak in the wavelength range of 420 nm or more and 500 nm or less, will be described, but this embodiment is not limited to this.

In the above case, the light-emitting device of this embodiment can have the follow mode (A) or (B), for example.

(A) The first illuminant has the emission peak in the wavelength range of 350 nm or more and 450 nm or less, and the phosphor according to Embodiment 1 of the first aspect of the present invention is used as the first phosphor of the second illuminant.

(B) The first illuminant has the emission peak in the wavelength range of 350 nm or more and 450 nm or less, and at least one type of phosphor (red phosphor) which has the emission peak in the wavelength range of more than 620 nm and less than 700 nm is used as the first phosphor of the second illuminant, and the phosphor according to Embodiment 1 of the first aspect of the present invention is used as the second phosphor of the second illuminant.

(Red Phosphor)

For the red phosphor in the above mentioned mode, the following phosphors, for example, can be suitably used.

Mn activating fluoride phosphor, such as $K_2(Si, Ti)F_6$:Mn, $K_2Si_{1-x}Na_xAl_xF_6$:Mn (0<x<1);

Sulfide phosphor, such as (Sr, Ca)S:Eu (CAS phosphor), $La_2O_2S$:Eu (LOS phosphor);

Garnet-based phosphor, such as (Y, Lu, Gd, Tb)$_3Mg_2AlSi_2O_{12}$:Ce;

Nano particles, such as CdSe; and

Nitride or oxynitride phosphor, such as (Sr, Ca) AlSiN$_3$:Eu(S/CASN phosphor), (CaAlSiN$_3$)$_{1-x}$(SiO$_2$N$_2$)$_x$:Eu (CASON phosphor), (La, Ca)$_3$(Al, Si)$_6$N$_{11}$:Eu (LSN phosphor), (Ca, Sr, Ba)$_2$Si$_5$(N,O)$_8$:Eu (258 phosphor), (Sr, Ca)Al$_{1+x}$Si$_{4-x}$O$_x$N$_{7-x}$:Eu (1147 phosphor), M$_x$ (Si, Al)$_{12}$(O,N)$_{16}$:Eu (M is Ca, Sr or the like) (α-sialon phosphor), Li(Sr, Ba)Al$_3$N$_4$: Eu (x above is all in the range of 0<x<1).

(Yellow Phosphor)

In the above modes, a phosphor which has an emission peak in the 550 nm to 600 nm range (yellow phosphor) may be used besides the phosphor according to Embodiment 1 of the first aspect of the present invention if necessary.

For the yellow phosphor, the following phosphors, for example, can be suitably used.

Garnet-based phosphor, such as (Y, Gd, Lu, Tb, La)$_3$(Al, G$_a$)$_5$O$_{12}$:(Ce, Eu, Nd);

Orthosilicate, such as (Ba, Sr, Ca, Mg)$_2$SiO$_4$:(Eu, Ce);

(Oxy)nitride phosphor, such as (Ba, Ca, Mg)Si$_2$O$_2$N$_2$:Eu (SION-based phosphor), (Li, Ca)$_2$(Si, Al)$_{12}$(O,N)$_{16}$: (Ce, Eu) (α-sialon phosphor), (Ca, Sr)AlSi$_4$(O,N)$_7$:(Ce, Eu) (1147 phosphor), (La, Ca, Y)$_3$(Al, Si)$_6$N$_{11}$:Ce(LSN phosphor).

In the above phosphors, the garnet-based phosphor is preferable, and particularly the YAG-based phosphor expressed by Y$_3$Al$_5$O$_{12}$:Ce is ideal.

[Configuration of Light-Emitting Device]

The light-emitting device of this embodiment has a first illuminant (excitation light source) and uses at least the phosphor according to Embodiment 1 of the first aspect of the present invention as the second illuminant, but the rest of the configuration is not limited, and any known device configuration may be used.

An example of an embodiment of the device configuration and the light-emitting device is disclosed in Japanese Patent Application Laid-open No. 2007-291352.

The other embodiments of the light-emitting device are: a shell type, a cup type, a chip-on-board, a remote phosphor and the like.

[Applications of Light-Emitting Device]

The applications of the light-emitting device according to Embodiment 2 of the first aspect of the present invention are not especially limited, and can be applied to various fields in which conventional light-emitting device are used, but this light-emitting device is particularly suitable as a light source of an illumination device and image display device, since the color reproduction range is wide, and the color rendering is superb.

1-3. Embodiment 3 of First Aspect of Invention: Illumination Device

Embodiment 3 of the first aspect of the present invention is an illumination device, which includes the light-emitting device according to Embodiment 2 of the first aspect of the invention as the light source.

In the case of applying the light-emitting device according to Embodiment 2 of the first aspect of the present invention to an illumination device, the above mentioned light-emitting device is appropriately integrated into a known illumination device. For example, a surface emission illumination device, where many light-emitting devices are disposed on the bottom surface of the housing case, can be implemented.

1-4. Embodiment 4 of First Aspect of Invention: Image Display Device

Embodiment 4 of the first aspect of the invention is an image display device which includes the light-emitting device according to Embodiment 2 of the first aspect of the invention as the light source.

In the case of applying the light-emitting device according to Embodiment 2 of the first aspect of the present invention to the light source of the image display device, it is preferable to use the light-emitting device together with the color filter, although an actual configuration of the image display device is not especially limited. For example, in the case of a color image display device using color liquid crystal display elements, the image display device can be implemented by using the above mentioned light-emitting devices as a backlight, and combining this backlight with optical shutters using liquid crystals and color filters having red, green and blue pixels.

2. Second Aspect of Invention

A second aspect of the present invention includes a phosphor (Embodiment 1), a light-emitting device (Embodiment 2), an illumination device (Embodiment 3), and an image display device (Embodiment 4). The second aspect of the present invention is also a preferred mode of the first aspect of the present invention, which was described above.

2-1. Embodiment 1 of Second Aspect of Invention: Phosphor

<Phosphor>

The phosphor according to Embodiment 1 of the second aspect of the present invention comprises a crystalline phase including elements M, A, Al, Si and N, and the space group thereof is P-6. M denotes an activating element, and A denotes one or more types of elements selected from the group consisting of alkaline earth metal elements.

For the characteristics and the like of the phosphor according to this embodiment, see <1-1. Embodiment 1 of first aspect of invention: phosphor>.

<One Embodiment of Second Aspect of Invention: Phosphor-Containing Composition>

For description on the phosphor-containing composition, which is one embodiment of the second aspect of the present invention, see <One embodiment of first aspect of invention: phosphor-containing composition>.

Embodiment 2 of Second Aspect of Invention: Light-Emitting Device

For description on the light-emitting device, which is the embodiment 2 of the second aspect of the present invention, see <1-2. Embodiment 2 of the first aspect of invention: light-emitting device>.

2-3. Embodiment 3 of Second Aspect of Invention: Illumination Device

For description on the illumination device, which is the embodiment 3 of the second aspect of the present invention, see <1-3. Embodiment 3 of the first aspect of invention: light-emitting device>.

2-4. Embodiment 4 of Second Aspect of Invention: Image Display Device

For description on the image display device, which is the embodiment 4 of the second aspect of the present invention, see <1-4. Embodiment 4 of first aspect of invention: image display device>.

EXAMPLES

This invention will be further described using concrete examples, but the present invention is not limited to the following examples, as long as there is no departure from the spirit of the present invention thereof. Examples are common to the first aspect and the second aspect of the present invention.

<Measurement Method>
[Emission Characteristics]

Each sample was filled into a sample holder made of copper, and the excitation spectrum and the emission spectrum were measured using the fluorescence spectrophotometer FP-6500 (made by JASCO Corporation). For the measurement, the slit width of the spectrometer on the light receiving side was set to 1 nm. The emission peak wavelength (hereafter called "peak wavelength") and the half-bandwidth of the emission peak were read from the acquired emission spectrum.

[Chromaticity Coordinates]

The chromaticity coordinates of the x and y color system (CIE 1931 color system) were calculated based on the data on the emission spectrum acquired by the above method in the 360 nm to 800 nm wavelength region using a method conforming to the JIS Z8724 standard, as the chromaticity coordinates CIEx and CIEy of the XYZ color system specified in JIS Z8701 standard.

[Internal Quantum Efficiency ($\eta_i$), External Quantum Efficiency ($\eta_o$) and Absorption Efficiency ($\alpha_q$)]

The measurement target phosphor sample was filled into a cell so as to have a sufficient flattened surface for measurement accuracy, and the cell was placed in an integrating sphere.

Light was introduced to the integrating sphere using an optical fiber, from the emission light source (150 W Xe lamp) to excite the phosphor. The emission peak wavelength of the light from this emission light source was adjusted using a monochrome meter (diffraction grating spectrometer), so that a 405 nm monochromatic light is generated. This monochromatic light as the excitation light was irradiated onto the measurement target phosphor sample, and the spectrum was measured for the emission (fluorescence) of the phosphor sample and the reflected light respectively using the spectrometer MCPD 7000 (made by Otsuka Electronics Co., Ltd.). The light in the integrating sphere was guided to the spectrometer using an optical fiber.

The absorption efficiency $\alpha_q$ is a value generated by dividing the photon number $N_{abs}$ of the excitation light absorbed by the phosphor sample by the total photon number N of the excitation light.

This total photon number N of the excitation light is in proportion to the numeric value determined by the following (Expression A). Therefore, as a measurement target, a "Spectralon" (which has a 99% reflectance R with respect to the excitation light having a 450 nm wavelength) made by Labsphere Inc., which is a reflector having an almost 100% reflectance R with respect to excitation light, was installed in the above mentioned integrating sphere in the same disposition as the phosphor sample, the excitation light was irradiated and the reflection spectrum $I_{ref}(\lambda)$ was measured using the spectrometer, whereby the value of the following (Expression A) was determined.

[Math. 1]

$$\frac{1}{R}\int \lambda \cdot I_{ref}(\lambda)d\lambda \quad \text{(Expression A)}$$

Here the integration interval is 410 nm to 480 nm.

The photon number $N_{abs}$ of the excitation light absorbed by the phosphor sample is in proportion to the quantity determined by the following (Expression B).

[Math. 2]

$$\frac{1}{R}\int \lambda \cdot I_{ref}(\lambda)d\lambda - \int \lambda \cdot I(\lambda)d\lambda \quad \text{(Expression B)}$$

Thereby $\alpha_q = N_{abs}/N =$ (Expression B)/(Expression A) was calculated.

Then the internal quantum efficiency $\eta_i$ was determined as follows. The internal quantum efficiency $\eta_i$ is a value generated by dividing the photon number $N_{PL}$, which originated from the fluorescence phenomenon, by the photon number $N_{abs}$ absorbed by the phosphor sample.

Here $N_{PL}$ is in proportion to the quantity determined by the following (Expression C). Hence this quantity was determined by the following (Expression C).

[Math. 3]

$$\int \lambda \cdot I(\lambda)d\lambda \quad \text{(Expression C)}$$

The integration interval is 481 nm to 800 nm.

Based on the above, $\eta_i =$ (Expression C)/(Expression B) was calculated, and the internal quantum efficiency $\eta_i$ was determined.

The integration of the spectrum which was converted into digital data was performed in the same manner as the case of determining the absorption efficiency $\alpha_q$.

Then the external quantum efficiency $\eta_o$ was determined by determining the product of the absorption efficiency $\alpha_q$ and the internal quantum efficiency $\eta_i$ determined above.

[Elemental Analysis by EPMA]

The following elemental analysis was performed to examine the composition of the acquired phosphor. Several crystals were selected by observation using a scanning electron microscope (SEM), and each element was analyzed using an electron probe micro analyzer (a wavelength dispersive X-ray spectroscopy device: EPMA) JXA-8200 (made by JEOL Ltd.).

[Elemental Analysis by EDX]

The following elemental analysis was performed to examine the composition of the acquired phosphor. The energy dispersive X-ray spectroscopy method was used to analyze the constituent metal elements (Sr, Ca, Ba, Si, Al, Eu). In concrete terms, several crystals of the example were selected by SEM observation, and were analyzed using the energy dispersive X-ray spectroscopy device EMAX ENERGY (based on EMAX x-act detector specifications) made by Horiba Ltd.

[TOF-SIMS Elemental Analysis]

For the crystals selected by SEM observation, time-of-flight secondary ion mass spectrometry (TOF-SIMS) was performed and confirmed whether boron was present.
(Machine)
TOF-SIMS5 (ION.ToF GmbH)
(Polarity Mode)
Positive, Negative
(Primary Ion)
Species: Bi1$^+$, Energy: 25 kV, Current: 1.25 pA, Field of view: 120×120 μm$^2$
(Sputter Ion)
Species: $O_2^+$ (Positive), Cs$^+$ (Negative), Energy: 2 kV Current: 360.0 nA (Positive), 135.0 nA (Negative), Crater Size: 450×450 μm$^2$
(Cycle Time)
80 μs
(Scan)
1024

[Powder X-Ray Diffraction Measurement]

The precise measurement of a powder-X-ray diffraction was performed using the powder-X-ray diffraction device D2 PHASER (made by Bruker Corporation). The measurement conditions follow.
CuKα bulb was used
X-ray output: 30 KV, 10 mA
Scanning range: 2θ=5° to 65°
Read width=0.025°

[Crystal Structure Analysis]

The X-ray diffraction data of a single crystal particle was measured using the single crystal X-ray diffraction device R-AXIS RAPID-II (made by Rigaku Corporation), which includes an imaging plate and a graphite monochrometer, using Mo Kα as an X-ray source. To collect data and refine the lattice constant, PROCESS-AUTO was used, and NUMABS was used for X-ray profile absorption correction. For the F$^2$ data, crystal structure parameters were refined using SHELXL-97.

[Lattice Constant Refinement]

The value of each lattice constant and the unit lattice volume were determined by selecting the peaks caused by the crystal structure of the phosphor of each example, that is, the crystal structure of which space group is classified as P-6, based on the powder X-ray diffraction measurement data of each example, and refining these peaks using the data processing software TOPAS 4 (made by Bruker Corporation).

<Manufacturing of Phosphor>

Example 1

Using $Sr_3N_2$ (made by Serac Corporation), $Mg_3N_2$ (made by Serac Corporation) EuN (made by Serac Corporation), $Si_3N_4$ (made by Ube Industries, Ltd.) and AlN (made by Tokuyama Corporation), the phosphor was prepared as follows.

The above raw materials were weighed by an electronic balance, so that each weight becomes as shown in Table 1, and are then put into an alumina mortar and crushed and mixed until it becomes uniform powder. These operations were performed in a glovebox filled with Ar gas.

TABLE 1

| | Material mixing amount (g) | | | | |
|---|---|---|---|---|---|
| | $Sr_3N_2$ | $Mg_3N_2$ | EuN | AlN | $Si_3N_4$ |
| Example 1 | 0.42 | 0.19 | 0.01 | 0.37 | 1.00 |

About 0.6 g of the acquired mixed powder material was weighed and filled into a crucible made of boron nitride. This crucible was placed in a vacuum pressure furnace (made by Shimadzu Mectem, Inc.). Then the pressure was reduced to 8×10$^{-3}$ or less, and then temperature was increased from room temperature to 800° C. by vacuum heating. When the temperature reached 800° C., this temperature was maintained, and a high purity nitrogen gas (99.9995%) is introduced for five minutes until the furnace pressure reached 0.85 MPa. After the high purity nitrogen gas was introduced, the temperature was further increased to 1600° C. while maintaining the furnace pressure at 0.85 MPa, and this state was maintained for one hour. Then the temperature was heated up to 2080° C., and the 2080° C. state was maintained for 4 hours. After this baking, the temperature was cooled down to 1200° C., and allowed to stand for further cooling. From the acquired product, single orange crystals were picked out and the phosphor in Example 1 was obtained.

FIG. 1 is the result when the phosphor in Example 1 was observed with a scanning electron microscope.

It was confirmed that all the crystals are those shown in FIG. 1. Further, elemental analysis (EPMA measurement) was performed on these crystals, and Table 2 shows the result.

TABLE 2

| Example 1 | N | Sr | Si | Eu | Al |
|---|---|---|---|---|---|
| Measurement result ※ | 54.28 | 4.07 | 33.61 | 0.09 | 7.95 |
| Conversion value when N = 40 | 40 | 3 | 24.77 | 0.06 | 5.86 |

※ Units of the values in this "measurement result" are "atomic %".

Figure 2:
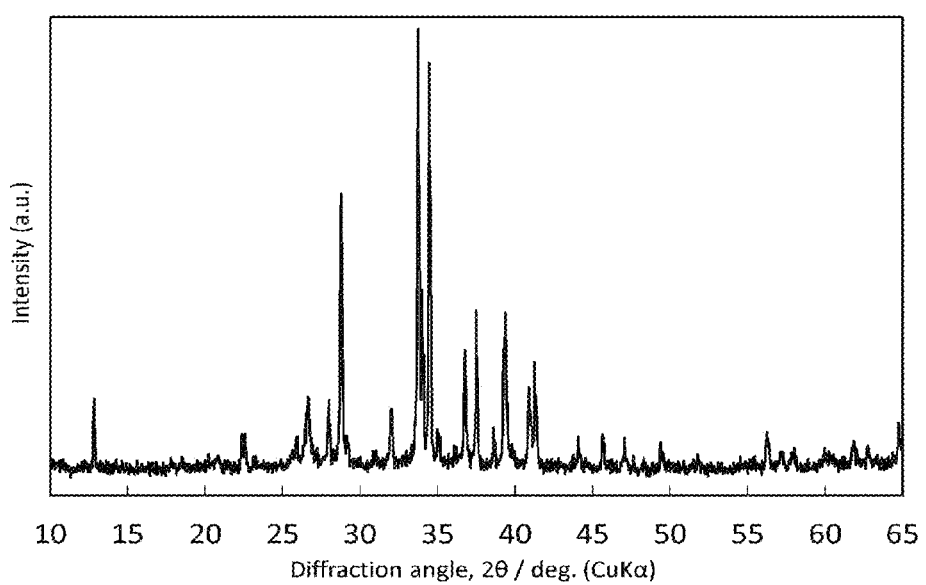
FIG. 2 is a graph depicting a powder X-ray diffraction (XRD) pattern of the phosphor acquired in Example 1.

Moreover, FIG. 2 shows the result when the phosphor of Example 1 was measured by powder X-ray diffraction measurement (XRD).

It was confirmed that the XRD pattern of the phosphor of Example 1 is not PDF but a new phosphor.

Further, single crystal structure analysis was performed on the phosphor of Example 1. A crystal model having a statistically possible average structure was analyzed by X-ray diffraction.

Figure 3:
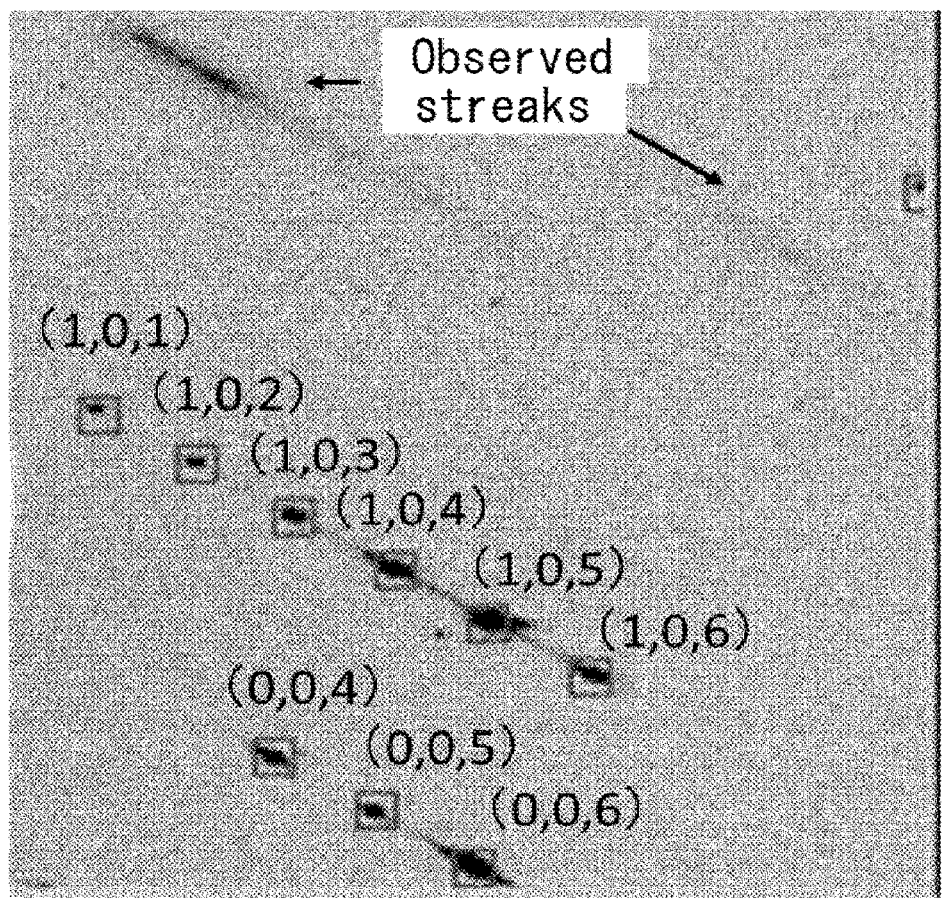
FIG. 3 is an image showing the result of a single crystal structure analysis of the phosphor acquired in Example 1 (drawing-substituting photo)

Based on the elementary reflection acquired by the X-ray diffraction in Example 1, it was confirmed that the crystal system of the average structure of the phosphor of Example 1 is a hexagonal crystal system, and the lattice constants were indexed as a=7.9522 Å, b=7.9522 Å, c=14.392 Å, α=90°, β=90° and γ=120°. In this case, streaks of the reflection image, which is due to the influence of lattice mismatching, were observed (FIG. 3). Therefore it is presumed that the phosphor of Example 1 includes an irregular structure in the crystal structure.

Furthermore, the acquired reflection points were studies based on the extinction rule, and the crystal structure was analyzed assumed that the space group of the phosphor of Example 1 is P-6. Table 3 shows the result of the crystal structure analysis. Based on this result, it was confirmed that the phosphor of Example 1 does not have a Sr site. Numbers in parenthesis indicate standard deviations.

TABLE 3

| Element | Occupancy rate | Coordinates x | y | z |
|---|---|---|---|---|
| Sr1 | 0.616 (11) | 0.000 | 0.000 | 0.1953 (2) |
| Eu1 | 0.0290 (5) | 0.000 | 0.000 | 0.1953 (2) |
| Sr2 | 1.00 | 0.667 | 0.333 | 0.500 |
| Sr3 | 0.708 (6) | 0.667 | 0.333 | 0.000 |
| Si1 | 0.80 | 0.0828 (6) | 0.5019 (6) | 0.3045 (2) |
| Al1 | 0.20 | 0.0828 (6) | 0.5019 (6) | 0.3045 (2) |
| Si2a | 0.269 (10) | 0.0835 (16) | 0.5116 (16) | 0.0985 (7) |
| Al2a | 0.067 (3) | 0.0835 (16) | 0.5116 (16) | 0.0985 (7) |
| Si2b | 0.531 (10) | 0.1695 (9) | 0.4156 (8) | 0.1053 (3) |
| Al2b | 0.133 (3) | 0.1695 (9) | 0.4156 (8) | 0.1053 (3) |
| Si3 | 0.80 | 0.2478 (5) | 0.1535 (5) | 0.3917 (2) |
| Al3 | 0.20 | 0.2478 (5) | 0.1535 (5) | 0.3917 (2) |
| Si4 | 0.80 | 0.4207 (7) | 0.2371 (7) | 0.1968 (2) |
| Al4 | 0.20 | 0.4207 (7) | 0.2371 (7) | 0.1968 (2) |
| Si5 | 0.80 | 0.1613 (8) | 0.4187 (8) | 0.500 |
| Al5 | 0.20 | 0.1613 (8) | 0.4187 (8) | 0.500 |
| Si6 | 0.80 | 0.2456 (9) | 0.1486 (9) | 0.000 |
| Al6 | 0.20 | 0.2456 (9) | 0.1486 (9) | 0.000 |
| N1 | 1.00 | 0.0069 (18) | 0.350 (2) | 0.4037 (7) |
| N2a | 0.336 (13) | 0.021 (8) | 0.326 (9) | 0.207 (3) |
| N2b | 0.664 (13) | 0.004 (4) | 0.355 (4) | 0.2014 (13) |
| N3 | 1.00 | 0.314 (3) | 0.287 (2) | 0.1016 (8) |
| N4 | 1.00 | 0.371 (2) | 0.317 (2) | 0.3010 (6) |
| N5 | 1.00 | 0.282 (3) | 0.279 (3) | 0.500 |
| N6a | 0.336 (13) | 0.037 (7) | 0.325 (9) | 0.000 |
| N6b | 0.664 (13) | 0.014 (5) | 0.361 (5) | 0.000 |
| N7 | 1.00 | 0.667 | 0.333 | 0.1773 (12) |
| N8 | 1.00 | 0.333 | 0.667 | 0.1034 (13) |
| N9 | 1.00 | 0.333 | 0.667 | 0.3044 (10) |
| N10 | 1.00 | 0.000 | 0.000 | 0.3679 (13) |
| N11 | 1.00 | 0.333 | 0.667 | 0.500 |
| N12 | 1.00 | 0.000 | 0.000 | 0.000 |

Figure 4:
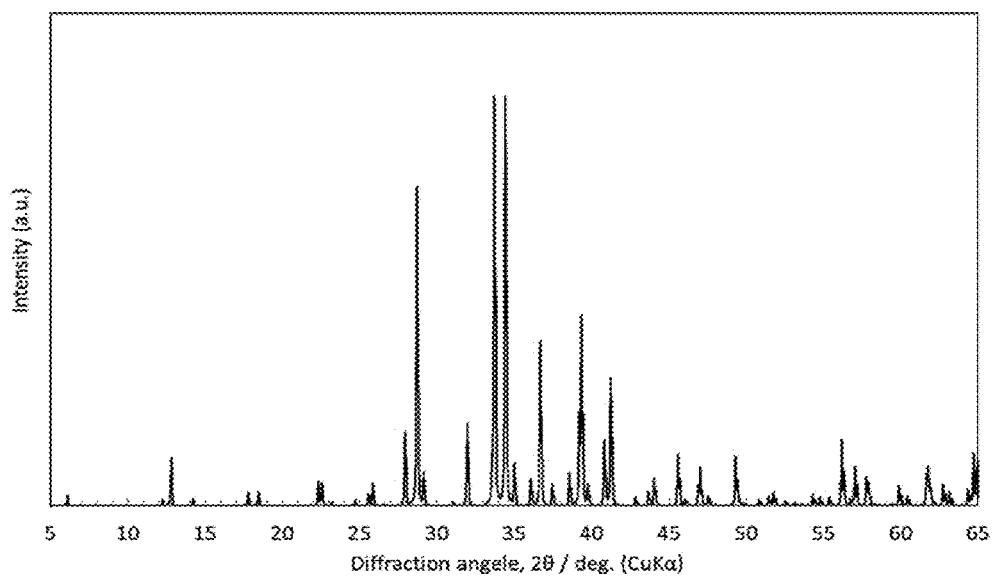
FIG. 4 is a graph depicting an XRD pattern acquired by simulation of the phosphor acquired in Example 1.

FIG. 4 shows the XRD pattern of the phosphor of Example 1 acquired by the simulation based on the above result.

The crystal system of the α-sialon according to Patent Literature 2 is a trigonal system, and the space group thereof is P31c. In other words, the phosphor of Example 1 has a different crystal system and different space group, and is a new phosphor having a different structure from α-sialon.

Concerning the phosphor of Example 1, Table 4 shows the ratio ($I/I_{max}$) of each peak intensity (I) of the highest peaks in regions 1 to 5 in the XRD measurement (excluding the maximum peak intensity ($I_{max}$) in region 3) with respect to the maximum peak intensity ($I_{max}$).

TABLE 4

|  | Example 1 |
|---|---|
| Region 1 ($I_1/I_{max}$) | 0.209 |
| Region 2 ($I_2/I_{max}$) | 0.648 |
| Region 3 ($I_3/I_{max}$) | 0.927 |
| Region 4 ($I_4/I_{max}$) | 0.396 |
| Region 5 ($I_5/I_{max}$) | 0.396 |

Figure 5:
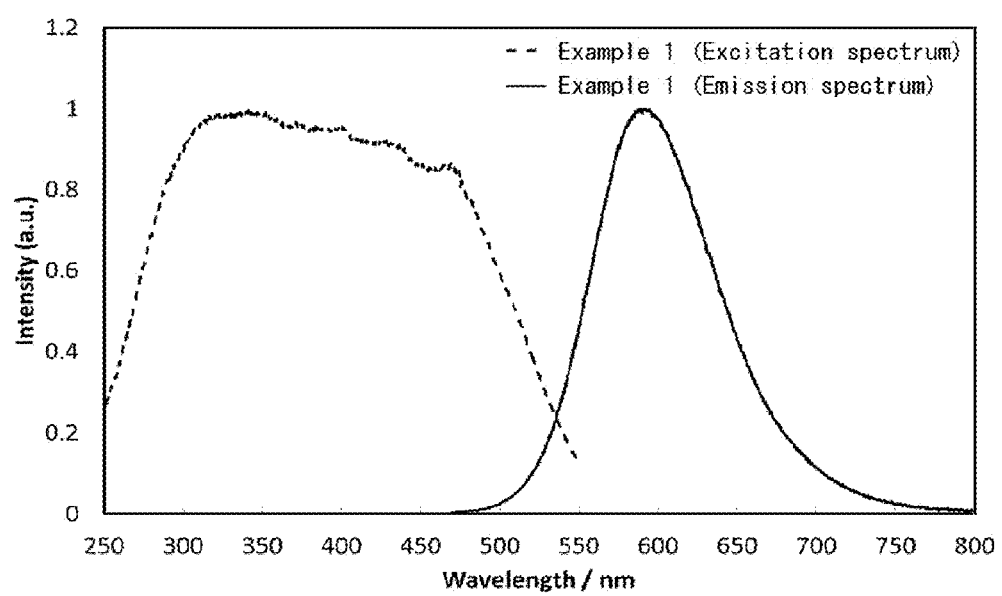
FIG. 5 is a graph depicting an excitation/emission spectrum of the phosphor acquired in Example 1.

FIG. 5 shows the excitation spectrum and the emission spectrum of the phosphor of Example 1.

The excitation spectrum of the phosphor of Example 1 is a measurement result when a 590 nm light emission is monitored, and the emission spectrum is a measurement result when light is excited at 400 nm.

The phosphor of Example 1 has a 591 nm emission peak wavelength and a 90 nm half-bandwidth, and emits an orange light.

[Temperature Characteristic Measurement Result]

The temperature characteristics were measured for the phosphor acquired in Example 1 and the YAG phosphor (P46-Y3: made by Mitsubishi Chemical Corporation) as the comparative example 1.

Figure 6:
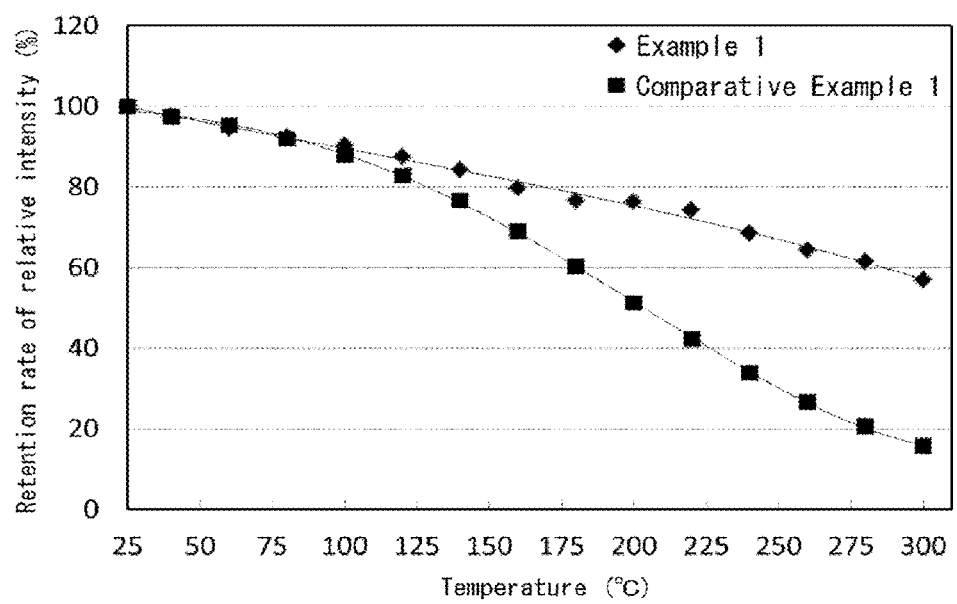
FIG. 6 is a graph depicting the temperature characteristics (relative intensity when the emission peak intensity at 25° C. is 100%) of the phosphor acquired in Example 1 and the phosphor of comparative example 1.

FIG. 6 and Table 5 shows the relative intensity (%) at each temperature, with respect to the emission peak intensity value at 25° C., in the emission spectrum when light having a 450 nm wavelength is irradiated.

TABLE 5

|  | Relative intensity (%) | | | |
|---|---|---|---|---|
|  | 25° C. | 150° C. | 200° C. | 250° C. |
| Example 1 | 100 | 83 | 76 | 67 |
| Comparative Example 1 | 100 | 74 | 50 | 25 |

As shown in FIG. 5, the phosphor of Example 1 has much better temperature characteristics than the phosphor of comparative example 1, even in the temperature region in the case when this phosphor is used for illumination devices and the like, such as around 200° C.

The phosphor of comparative example 1 corresponds to the phosphor disclosed in Patent Literature 1, which is commonly used as a yellow phosphor. Therefore it is a surprising effect that the characteristics of this phosphor are equivalent to or better than those of the phosphor of comparative example 1.

Examples 2 to 6

The phosphors of Examples 2 to 6 were obtained by synthesizing in the same manner as Example 1, except that each weight of the materials were changed as shown in Table 6, and the holding time at 2080° C. was changed from 4 hours to 8 hours.

TABLE 6

| | Prepared composition [$(M_mA_aAl_bSi_cN_{40})$] | | | | | Material mixing amount (g) | | | |
|---|---|---|---|---|---|---|---|---|---|
| | Compositional formula | a | b | c | (b + c)/a | m | $Sr_3N_2$ | EuN | AlN | $Si_3N_4$ |
| Example 2 | $Sr_{2.68}Eu_{0.03}Al_{5.42}Si_{24.58}N_{40}$ | 2.68 | 5.42 | 24.58 | 11.08 | 0.03 | 0.24 | 0.01 | 0.20 | 1.05 |
| Example 3 | $Sr_{2.97}Eu_{0.03}Al_{6.00}Si_{24.00}N_{40}$ | 2.97 | 6.00 | 24.00 | 10.00 | 0.03 | 0.26 | 0.01 | 0.22 | 1.01 |
| Example 4 | $Sr_{3.09}Eu_{0.03}Al_{6.24}Si_{23.76}N_{40}$ | 3.09 | 6.24 | 23.76 | 9.61 | 0.03 | 0.27 | 0.01 | 0.23 | 1.00 |
| Example 5 | $Sr_{3.67}Eu_{0.04}Al_{7.42}Si_{22.58}N_{40}$ | 3.67 | 7.42 | 22.58 | 8.09 | 0.04 | 0.31 | 0.01 | 0.26 | 0.92 |
| Example 6 | $Sr_{3.96}Eu_{0.04}Al_{8.00}Si_{22.00}N_{40}$ | 3.96 | 8.00 | 22.00 | 7.50 | 0.04 | 0.33 | 0.01 | 0.28 | 0.88 |

Figure 7:
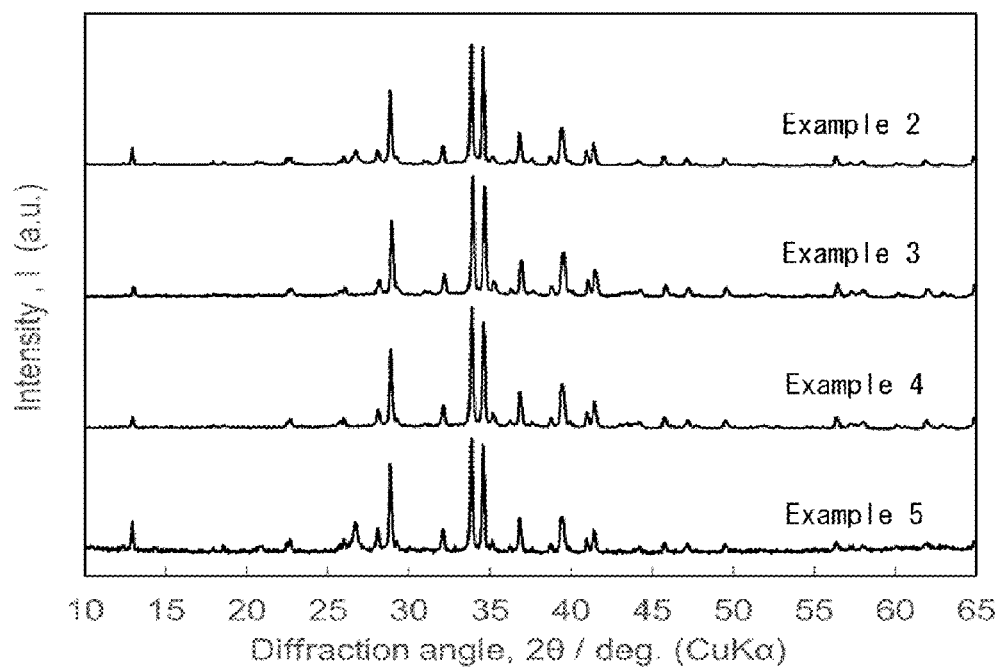
FIG. 7 is a graph depicting XRD patterns of the phosphor acquired in Examples 2 to 5.

FIG. 7 shows the result when the phosphors of Example 2 to 5 were measured by XRD. It was confirmed that in Example 2 to 5, the phase having the same crystal structure as the phosphor of Example 1 was acquired roughly in a single phase.

The phosphor of Example 6 was also measured by XRD, and it was confirmed that the phase having the same crystal structure as Example 1 was obtained.

Table 7 shows the result of making each lattice constant and the unit lattice volume more precise, for the phase having the same crystal structure as Example 1, based on the powder XRD patterns of the phosphors of Example 2 to 6. It was confirmed that the lattice volume increases as the Sr amount increases. The phosphors of Example 2 to 6 have the same crystal structure as Example 1 (hexagonal crystal structure and space group P-6), and were generated as phosphors having different Sr content in the respective structures.

Figure 8:
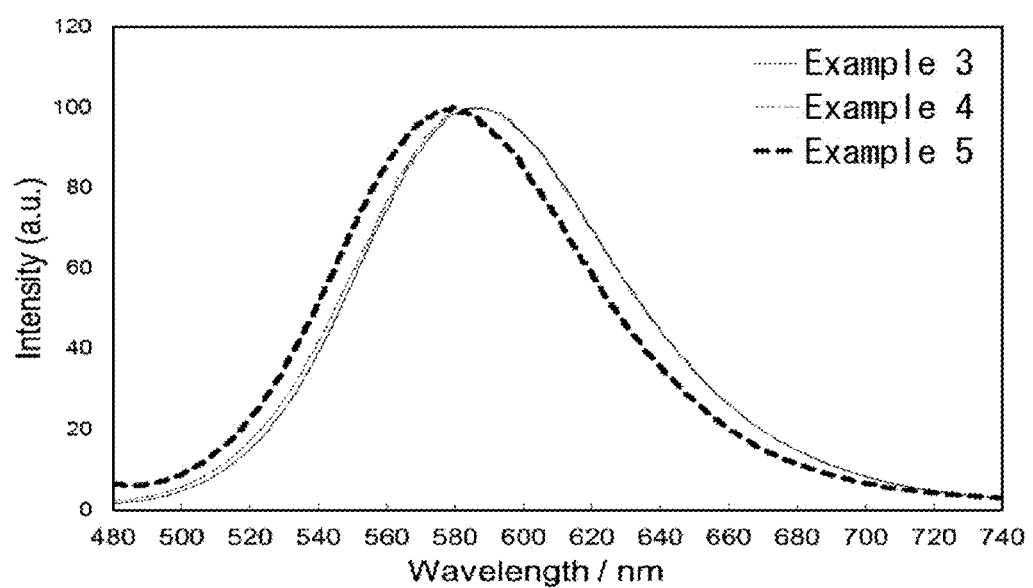
FIG. 8 is a graph depicting emission spectra of the phosphor acquired in Examples 3 to 5.

Further, the emission spectrum when excited by a 455 nm light was measured for each phosphor of Example 2 to 6 respectively. FIG. 8 shows the emission spectrum of the phosphors of Examples 3 to 5. Table 9 shows the emission peak wavelength and the chromaticity of the phosphors of Example 2 to 6.

TABLE 9

| | Emission peak wavelength (nm) | CIE x | CIE y | Half-bandwidth (nm) |
|---|---|---|---|---|
| Example 2 | 584 | 0.500 | 0.486 | 91 |
| Example 3 | 584 | 0.495 | 0.488 | 92 |
| Example 4 | 581 | 0.494 | 0.489 | 91 |
| Example 5 | 581 | 0.484 | 0.487 | 102 |
| Example 6 | 578 | 0.460 | 0.495 | 111 |

TABLE 7

| | Unit lattice volume | Lattice constant | | | | | |
|---|---|---|---|---|---|---|---|
| | $V[10^6 pm^3]$ | a[Å] | b[Å] | c[Å] | α° | β° | γ° |
| Example 2 | 784.52 | 7.938 | 7.938 | 14.376 | 90 | 90 | 120 |
| Example 3 | 785.11 | 7.940 | 7.940 | 14.380 | 90 | 90 | 120 |
| Example 4 | 785.29 | 7.941 | 7.941 | 14.381 | 90 | 90 | 120 |
| Example 5 | 786.83 | 7.946 | 7.946 | 14.389 | 90 | 90 | 120 |
| Example 6 | 786.92 | 7.945 | 7.945 | 14.395 | 90 | 90 | 120 |

Concerning the phosphor of Example 4, Table 8 shows the ratio ($I/I_{max}$) of each peak intensity (I) of the highest peak in the regions 1 to 5 in the XRD measurement (excluding the maximum peak intensity ($I_{max}$) in region 3) with respect to the maximum peak intensity ($I_{max}$).

TABLE 8

| | Example 4 |
|---|---|
| Region 1 ($I_1/I_{max}$) | 0.109 |
| Region 2 ($I_2/I_{max}$) | 0.643 |
| Region 3 ($I_3/I_{max}$) | 0.879 |
| Region 4 ($I_4/I_{max}$) | 0.328 |
| Region 5 ($I_5/I_{max}$) | 0.385 |

As shown in Table 9, the emission colors can also be adjusted by adjusting the Sr content.

Examples 7 to 12

The phosphors of Examples 7 to 12 were acquired by synthesizing in the same manner as Example 1, except that each weight of the materials were changed as shown in Table 10, and "the holding at 2080° C. for 4 hours" was changed to "the holding at 2050° C. for 8 hours".

TABLE 10

| | Prepared composition [$(M_mA_aAl_bSi_cN_{40})$] | | | | | | Material mixing amount (g) | | | |
|---|---|---|---|---|---|---|---|---|---|---|
| | Compositional formula | a | b | c | (b + c)/a | m | $Sr_3N_2$ | EuN | AlN | $Si_3N_4$ |
| Example 7 | $Sr_{2.97}Eu_{0.03}Al_{6.00}Si_{24.00}N_{40}$ | 2.97 | 6.00 | 24.00 | 10.00 | 0.03 | 0.26 | 0.01 | 0.22 | 1.01 |
| Example 8 | $Sr_{2.91}Eu_{0.09}Al_{6.00}Si_{24.00}N_{40}$ | 2.91 | 6.00 | 24.00 | 10.00 | 0.09 | 0.25 | 0.02 | 0.22 | 1.01 |
| Example 9 | $Sr_{2.85}Eu_{0.15}Al_{6.00}Si_{24.00}N_{40}$ | 2.85 | 6.00 | 24.00 | 10.00 | 0.15 | 0.25 | 0.03 | 0.22 | 1.00 |
| Example 10 | $Sr_{2.79}Eu_{0.21}Al_{6.00}Si_{24.00}N_{40}$ | 2.79 | 6.00 | 24.00 | 10.00 | 0.21 | 0.24 | 0.04 | 0.22 | 1.00 |
| Example 11 | $Sr_{2.70}Eu_{0.30}Al_{6.00}Si_{24.00}N_{40}$ | 2.70 | 6.00 | 24.00 | 10.00 | 0.30 | 0.23 | 0.06 | 0.22 | 0.99 |
| Example 12 | $Sr_{2.55}Eu_{0.45}Al_{6.00}Si_{24.00}N_{40}$ | 2.55 | 6.00 | 24.00 | 10.00 | 0.45 | 0.22 | 0.09 | 0.22 | 0.98 |

Figure 9:
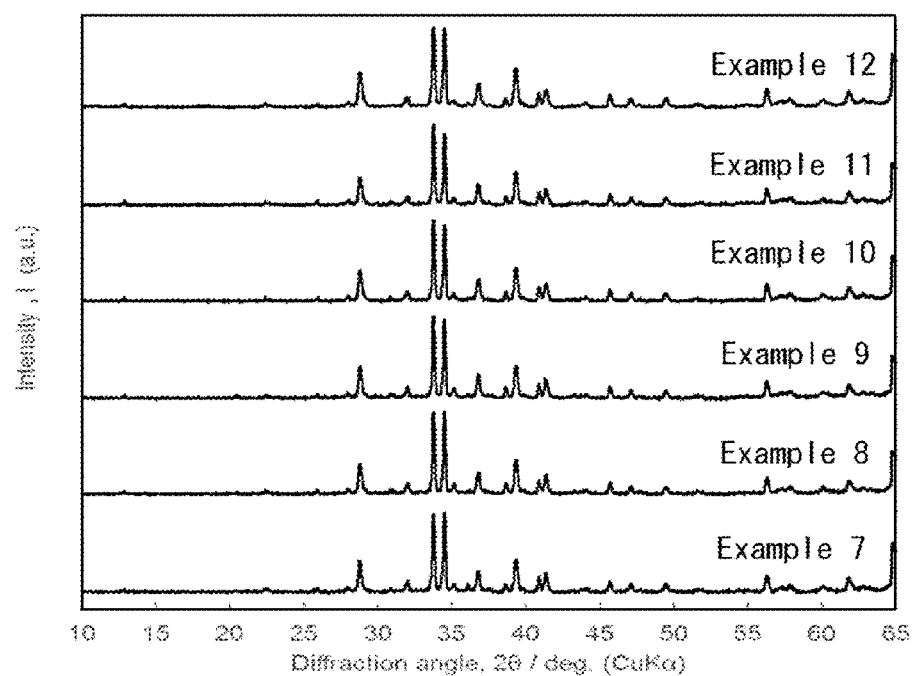
FIG. 9 is a graph depicting XRD patterns of the phosphor acquired in Examples 7 to 12.

FIG. 9 shows the result when the phosphors of Example 7 to 12 were measured by XRD. It was confirmed that in Example 7 to 12, the phase having the same crystal structure as the phosphor of Example 1 was obtained approximately in a single phase.

Table 11 shows the result of making each lattice constant and the unit lattice volume more precise, for the phase having the same crystal structure as Example 1 of these, based on the powder XRD patterns of the phosphors of Examples 7 to 10. It was confirmed that the phosphors have the same crystal structure as Example 1, and were generated as phosphors having different Eu content in the respective structures.

TABLE 11

| | Unit lattice volume | Lattice constant | | | | | |
|---|---|---|---|---|---|---|---|
| | $V[10^6 \text{ pm}^3]$ | a[Å] | b[Å] | c[Å] | α° | β° | γ° |
| Example 7 | 785.76 | 7.942 | 7.942 | 14.386 | 90 | 90 | 120 |
| Example 8 | 785.50 | 7.941 | 7.941 | 14.383 | 90 | 90 | 120 |
| Example 9 | 785.73 | 7.942 | 7.942 | 14.385 | 90 | 90 | 120 |
| Example 10 | 785.93 | 7.944 | 7.944 | 14.380 | 90 | 90 | 120 |

Concerning the phosphor of Example 12, Table 12 shows the ratio ($I/I_{max}$) of each peak intensity (I) of the highest peak in the regions 1 to 5 in the XRD measurement (excluding the maximum peak intensity ($I_{max}$) in region 3) with respect to the maximum peak intensity ($I_{max}$).

TABLE 12

| | Example 12 |
|---|---|
| Region 1 ($I_1/I_{max}$) | 0.181 |
| Region 2 ($I_2/I_{max}$) | 0.513 |
| Region 3 ($I_3/I_{max}$) | 0.976 |
| Region 4 ($I_4/I_{max}$) | 0.393 |
| Region 5 ($I_5/I_{max}$) | 0.564 |

Figure 10:
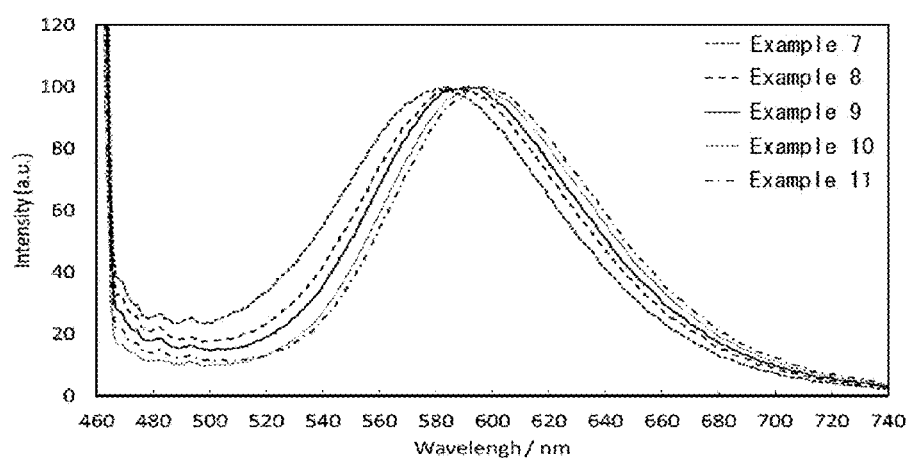
FIG. 10 is a graph depicting emission spectra of the phosphor acquired in Examples 7 to 11.

Further, the emission spectrum when excited by a 455 nm light was measured for each phosphor of Example 7 to 12 respectively. FIG. 10 shows the emission spectrum of the phosphors of Examples 7 to 11. Table 13 shows the emission peak wavelength and the chromaticity of the phosphors of Examples 7 to 12.

TABLE 13

| | Emission peak wavelength (nm) | CIE x | CIE y | Half-bandwidth (nm) |
|---|---|---|---|---|
| Example 7 | 584 | 0.476 | 0.495 | 95 |
| Example 8 | 584 | 0.500 | 0.477 | 92 |
| Example 9 | 591 | 0.513 | 0.467 | 92 |
| Example 10 | 595 | 0.533 | 0.453 | 90 |
| Example 11 | 596 | 0.537 | 0.446 | 90 |
| Example 12 | 598 | 0.553 | 0.435 | 89 |

As shown in Table 13, the emission colors can also be adjusted by adjusting the Eu content.

Examples 13 to 18

The phosphors of Examples 13 to 18 were acquired by synthesizing in the same manner as Example 1, except that the materials and each weight of the materials were changed as shown in Table 14, and "the holding at 2080° C. for 4 hours" was changed to "the holding at 2050° C. for 8 hours".

TABLE 14

| | Prepared composition [$(M_mA_aAl_bSi_cN_{40})$] | | | | | | | Material mixing amount (g) | | | | |
|---|---|---|---|---|---|---|---|---|---|---|---|---|
| | Compositional formula | Sr | Ca | a | b | c | (b + c)/a | m | $Sr_3N_2$ | $Ca_3N_2$ | EuN | AlN | $Si_3N_4$ |
| Example 13 | $Sr_{3.63}Eu_{0.07}Al_{7.40}Si_{22.60}N_{40}$ | 1.00 | 0.00 | 3.63 | 7.40 | 22.60 | 8.11 | 0.07 | 0.306 | 0.000 | 0.011 | 0.264 | 0.920 |
| Example 14 | $Sr_{3.59}Ca_{0.04}Eu_{0.07}Al_{7.40}Si_{22.60}N_{40}$ | 0.99 | 0.01 | 3.63 | 7.40 | 22.60 | 8.11 | 0.07 | 0.303 | 0.002 | 0.011 | 0.264 | 0.920 |
| Example 15 | $Sr_{3.52}Ca_{0.11}Eu_{0.07}Al_{7.40}Si_{22.60}N_{40}$ | 0.97 | 0.03 | 3.63 | 7.40 | 22.60 | 8.11 | 0.07 | 0.298 | 0.005 | 0.011 | 0.265 | 0.922 |
| Example 16 | $Sr_{3.44}Ca_{0.18}Eu_{0.07}Al_{7.40}Si_{22.60}N_{40}$ | 0.95 | 0.05 | 3.63 | 7.40 | 22.60 | 8.11 | 0.07 | 0.292 | 0.008 | 0.011 | 0.265 | 0.924 |
| Example 17 | $Sr_{3.26}Ca_{0.36}Eu_{0.07}Al_{7.40}Si_{22.60}N_{40}$ | 0.90 | 0.10 | 3.63 | 7.40 | 22.60 | 8.11 | 0.07 | 0.278 | 0.016 | 0.011 | 0.267 | 0.929 |
| Example 18 | $Sr_{2.9}Ca_{0.73}Eu_{0.07}Al_{7.40}Si_{22.60}N_{40}$ | 0.80 | 0.20 | 3.63 | 7.40 | 22.60 | 8.11 | 0.07 | 0.250 | 0.032 | 0.011 | 0.269 | 0.938 |

Figure 11:
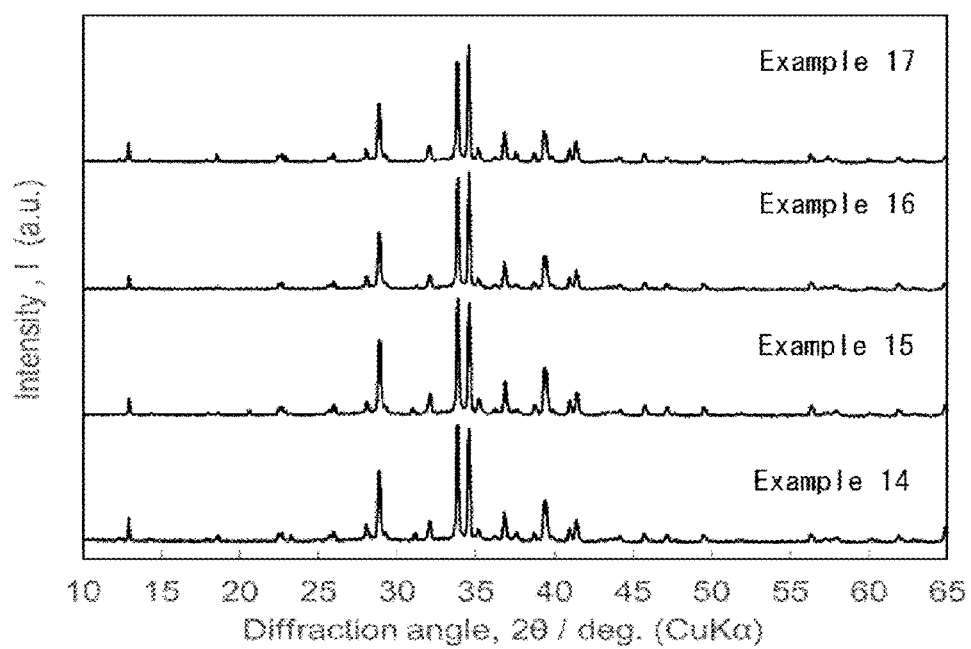
FIG. 11 is a graph depicting XRD patterns of the phosphor acquired in Examples 14 to 17.

FIG. 11 shows the result when the phosphors of Example 14 to 17 were measured by XRD. It was confirmed that in Examples 14 to 17 of these, the phase having the same crystal structure as the phosphor of Example 1 was acquired roughly in a single phase.

The phosphor of Example 18 was also measured by XRD, and it was confirmed that the phase having the same crystal structure as Example 1 was acquired.

Table 15 shows the result of making each lattice constant and the unit lattice volume more precise, for the phase having the same crystal structure as Example 1 of these, based on the powder XRD patterns of the phosphors of Examples 14 to 17.

TABLE 15

| | Unit lattice volume | Lattice constant | | | | | |
|---|---|---|---|---|---|---|---|
| | $V[10^6 \text{ pm}^3]$ | a[Å] | b[Å] | c[Å] | α° | β° | γ° |
| Example 14 | 786.99 | 7.947 | 7.947 | 14.390 | 90 | 90 | 120 |
| Example 15 | 786.99 | 7.947 | 7.947 | 14.390 | 90 | 90 | 120 |
| Example 16 | 786.77 | 7.946 | 7.946 | 14.388 | 90 | 90 | 120 |
| Example 17 | 786.41 | 7.945 | 7.945 | 14.386 | 90 | 90 | 120 |

Concerning the phosphor of Example 17, Table 16 shows the ratio ($I/I_{max}$) of each peak intensity (I) of the highest peak in the regions 1 to 5 in the XRD measurement (excluding the maximum peak intensity ($I_{max}$) in region 3) with respect to the maximum peak intensity ($I_{max}$).

TABLE 16

| | Example 17 |
|---|---|
| Region 1 ($I_1/I_{max}$) | 0.198 |
| Region 2 ($I_2/I_{max}$) | 0.516 |

TABLE 16-continued

| | Example 17 |
|---|---|
| Region 3 ($I_3/I_{max}$) | 0.864 |
| Region 4 ($I_4/I_{max}$) | 0.281 |
| Region 5 ($I_5/I_{max}$) | 0.293 |

Moreover, Table 17 shows the atomic ratio of Sr:Ca:Al:Si when the phosphors of Examples 14 to 17 are measured by EDX, and the substitution content of Ca.

TABLE 17

| | Ratio | | Measured values | | | | |
|---|---|---|---|---|---|---|---|
| | Ca concentration (%) (Ca/Ca + Eu + Sr) | (Si + Al)/ (Ca + Sr + Eu) | Al | Si | Ca | Sr | Eu |
| Example 14 | 1.8% | 10.83 | 9.19 | 39.76 | 0.08 | 4.3 | 0.14 |
| Example 15 | 3.0% | 10.35 | 10.52 | 47.33 | 0.17 | 5.21 | 0.21 |
| Example 16 | 6.1% | 11.10 | 9.01 | 36.84 | 0.25 | 3.79 | 0.09 |
| Example 17 | 11.2% | 9.20 | 12.01 | 51.27 | 0.77 | 5.8 | 0.31 |

As shown in Table 15, Table 16 and Table 17, in the phosphors of Example 14 to 17, the same crystal phase as Example 1 was obtained in roughly a single phase. In the phosphor of Example 18, the phase having the same structure as Example 1 was acquired in the main phase. Further, it was confirmed that the unit lattice volume decreases as the substitution content of Ca increases, and the phosphor which has the same crystal structure as Example 1 and a part of Sr in the structure substituted by Ca can be acquired.

Further, it was confirmed that the phosphor of Example 13 contains boron (B) by TOP-SIMS analysis. The content of boron (B) was the detection limit of the EPMA analysis or less, which suggests that $Sr_3(Al, B)_6Si_{24}N_{40}$:Eu was generated, because of the mixing boron originally in a BN crucible.

Figure 12:
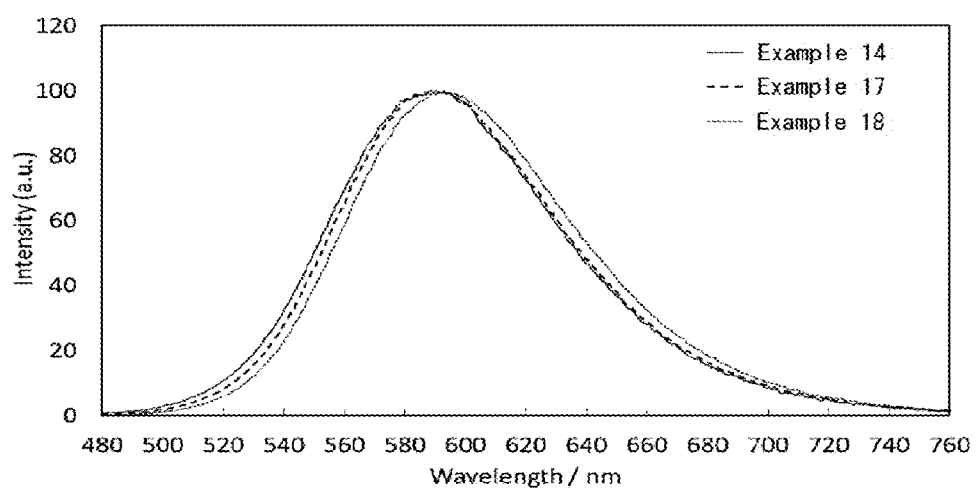
FIG. 12 is a graph depicting emission spectra of the phosphor acquired in Examples 14, 17 and 18.

Furthermore, the emission spectrum, when the phosphors of Examples 13 to 18 were excited by light having a 450 nm wavelength, was measured. FIG. 12 shows the emission spectrum of each phosphor of Examples 14, 17, and 18. Table 18 shows the emission peak wavelength, the half-bandwidth and the chromaticity of each phosphor of Examples 13 to 18.

TABLE 18

| | Emission peak wavelength (nm) | CIE x | CIE y | Half-bandwidth (nm) |
|---|---|---|---|---|
| Example 13 | 592 | 0.529 | 0.462 | 87 |
| Example 14 | 592 | 0.527 | 0.464 | 87 |
| Example 15 | 593 | 0.530 | 0.462 | 87 |
| Example 16 | 593 | 0.533 | 0.459 | 86 |
| Example 17 | 592 | 0.533 | 0.457 | 85 |
| Example 18 | 598 | 0.520 | 0.463 | 88 |

As shown in Table 18, the emission colors can be adjusted by substituting a part of Sr by Ca.

Examples 19 to 23

The phosphors of Examples 19 to 23 were acquired by synthesizing in the same manner as Example 1, except that the materials and each weight of the materials were changed as shown in Table 19, and "the holding at 2080° C. for 4 hours" was changed to "the holding at 2050° C. for 8 hours".

Figure 13:
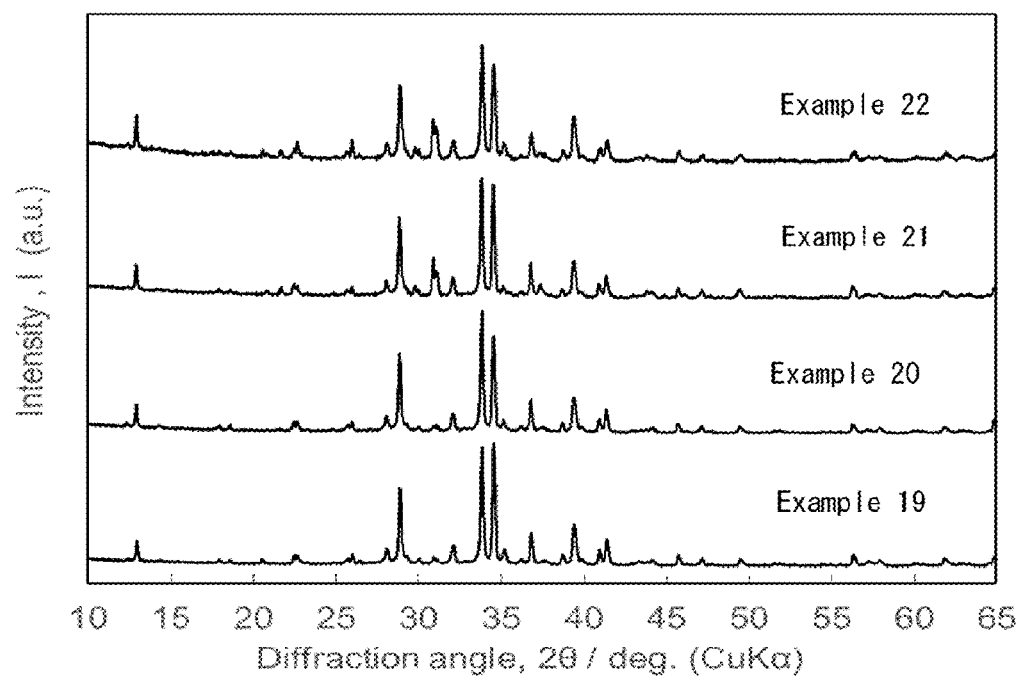
FIG. 13 is a graph depicting XRD patterns of the phosphor acquired in Examples 19 to 22.

FIG. 13 shows the result when the phosphors of Example 19 to 22 of these were measured by a powder X-ray diffraction (XRD). Table 20 shows the result of making the lattice constant and the unit lattice volume more precisely based on the powder XRD pattern of the phosphor of Example 23.

TABLE 20

| | Unit lattice volume | Lattice constant | | | | | |
|---|---|---|---|---|---|---|---|
| | $V[10^6 \text{ pm}^3]$ | a[Å] | b[Å] | c[Å] | a° | β° | γ° |
| Example 23 | 791.01 | 7.949 | 7.949 | 14.456 | 90 | 90 | 120 |

Concerning the phosphor of Example 21, Table 21 shows the ratio ($I/I_{max}$) of each peak intensity (I) of the highest peak in the regions 1 to 5 in the XRD measurement (excluding the maximum peak intensity ($I_{max}$) in region 3) with respect to the maximum peak intensity ($I_{max}$).

TABLE 21

| | Example 21 |
|---|---|
| Region 1 ($I_1/I_{max}$) | 0.314 |
| Region 2 ($I_2/I_{max}$) | 0.696 |
| Region 3 ($I_3/I_{max}$) | 0.946 |
| Region 4 ($I_4/I_{max}$) | 0.328 |
| Region 5 ($I_5/I_{max}$) | 0.341 |

Moreover, Table 22 shows the atomic ratio of Sr:Ba:Al:Si when the phosphors of Examples 19, 21 and 22 are measured by EDX, and the substitution content of Ba.

TABLE 19

| | Prepared composition [($M_mA_aAl_bSi_cN_{40}$)] | | | | | | | Material mixing amount (g) | | | | |
|---|---|---|---|---|---|---|---|---|---|---|---|---|
| | Compositional formula | Sr | Ba | a | b | c | (b + c)/a | m | $Sr_3N_2$ | $Ba_3N_2$ | EuN | AlN | $Si_3N_4$ |
| Example 19 | $Sr_{3.59}Ba_{0.04}Eu_{0.07}Al_{7.40}Si_{22.60}N_{40}$ | 0.99 | 0.01 | 3.63 | 7.40 | 22.60 | 8.11 | 0.07 | 0.303 | 0.005 | 0.011 | 0.264 | 0.919 |
| Example 20 | $Sr_{3.52}Ba_{0.11}Eu_{0.07}Al_{7.40}Si_{22.60}N_{40}$ | 0.97 | 0.03 | 3.63 | 7.40 | 22.60 | 8.11 | 0.07 | 0.296 | 0.014 | 0.011 | 0.263 | 0.917 |
| Example 21 | $Sr_{3.44}Ba_{0.18}Eu_{0.07}Al_{7.40}Si_{22.60}N_{40}$ | 0.95 | 0.05 | 3.63 | 7.40 | 22.60 | 8.11 | 0.07 | 0.289 | 0.023 | 0.011 | 0.263 | 0.915 |
| Example 22 | $Sr_{3.26}Ba_{0.36}Eu_{0.07}Al_{7.40}Si_{22.60}N_{40}$ | 0.90 | 0.10 | 3.63 | 7.40 | 22.60 | 8.11 | 0.07 | 0.273 | 0.046 | 0.011 | 0.261 | 0.910 |
| Example 23 | $Sr_{2.9}Ba_{0.73}Eu_{0.07}Al_{7.40}Si_{22.60}N_{40}$ | 0.80 | 0.20 | 3.63 | 7.40 | 22.60 | 8.11 | 0.07 | 0.240 | 0.091 | 0.011 | 0.259 | 0.901 |

TABLE 22

| | Ratio | | Measured values | | | | |
|---|---|---|---|---|---|---|---|
| | Ba concentration (%) (Ba/Ba + Eu + Sr) | (Si + Al)/ (Ba + Sr + Eu) | Al | Si | Sr | Ba | Eu |
| Example 19 | 1.8% | 11.19 | 12.28 | 42.44 | 4.56 | 0.09 | 0.24 |
| Example 21 | 3.7% | 11.75 | 9.13 | 45.53 | 4.35 | 0.17 | 0.13 |
| Example 22 | 5.3% | 10.71 | 10.29 | 46.6 | 4.82 | 0.28 | 0.21 |

It was confirmed that a phosphor which has the same structure as Example 1 and in which a part of the Sr elements is substituted by the Ba elements, can be acquired in the main phase.

Figure 14:
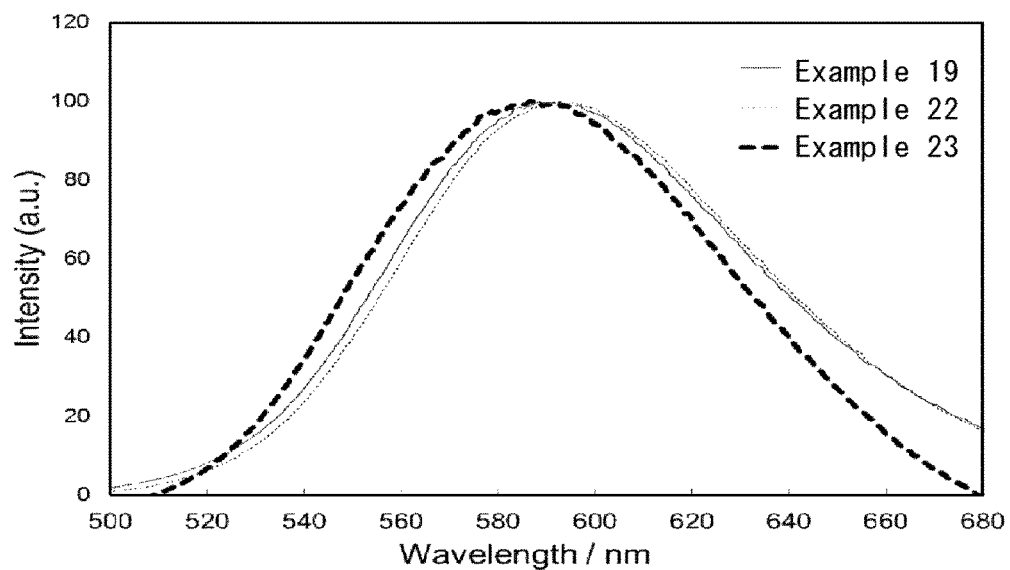
FIG. 14 is a graph depicting emission spectra of the phosphor acquired in Examples 19, 22 and 23.

FIG. 14 shows the emission spectrum of each phosphor of Examples 19, 22 and 23 when the phosphor was excited by light having a 450 nm wavelength. As FIG. 14 shows, the same emission spectrum was acquired by substituting a part of the Sr elements by Ba elements.

Examples 24 to 26

The phosphors of Examples 24 to 26 were acquired by synthesizing in the same manner as Example 1, except that the materials and each weight of the materials were changed as shown in Table 23, the pressure after introducing pure nitrogen gas is changed from "0.85 PMa" to "0.5 PMa", and "the holding at 2080° C. for 4 hours" was changed to "the holding at 1950° C. for 12 hours".

TABLE 23

| | Prepared composition [$(M_mA_aAl_bSi_cN_{40})$] | | | | | | | Material mixing amount (g) | | | | |
|---|---|---|---|---|---|---|---|---|---|---|---|---|
| | Compositional formula | Sr | Ca | a | b | c | (b + c)/a | m | $Sr_3N_2$ | $Ca_3N_2$ | EuN | AlN | $Si_3N_4$ |
| Example 24 | $Sr_{3.06}Eu_{0.06}Al_{6.24}Si_{23.76}N_{40}$ | 1.00 | 0.00 | 3.06 | 6.24 | 23.76 | 9.61 | 0.06 | 0.266 | 0.000 | 0.009 | 0.229 | 0.996 |
| Example 25 | $Sr_{2.97}Ca_{0.09}Eu_{0.06}Al_{6.24}Si_{23.76}N_{40}$ | 0.97 | 0.03 | 3.06 | 6.24 | 23.76 | 9.61 | 0.06 | 0.259 | 0.004 | 0.009 | 0.230 | 0.998 |
| Example 26 | $Sr_{2.91}Ca_{0.15}Eu_{0.06}Al_{6.24}Si_{23.76}N_{40}$ | 0.95 | 0.05 | 3.06 | 6.24 | 23.76 | 9.61 | 0.06 | 0.254 | 0.007 | 0.009 | 0.230 | 1.000 |

Figure 15:
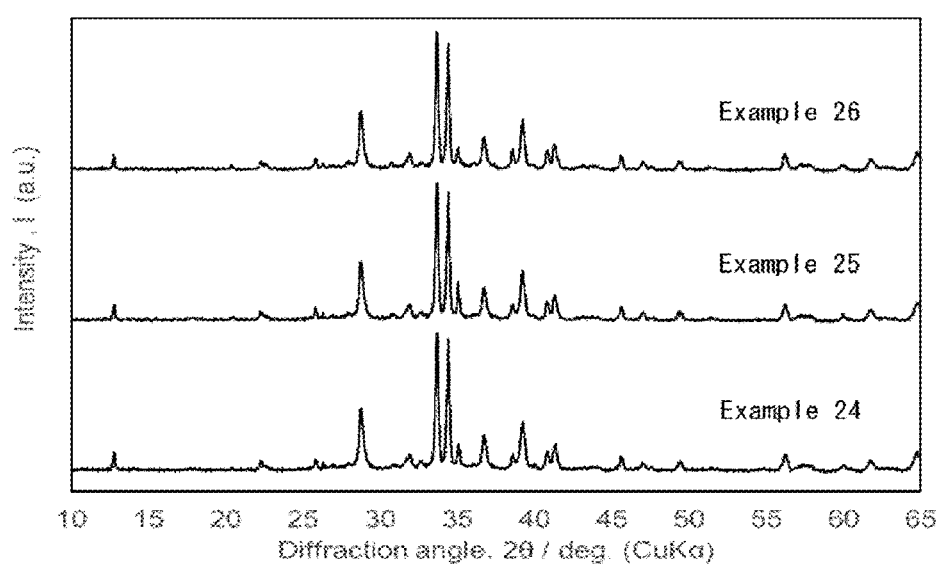
FIG. 15 is a graph depicting XRD patterns of the phosphor acquired in Examples 24 to 26.

FIG. 15 shows the result when the phosphors of Example 24 to 26 of these were measured by a powder X-ray diffraction (XRD). The same crystalline phase as Example 1 was acquired roughly in a single phase.

Figure 16:
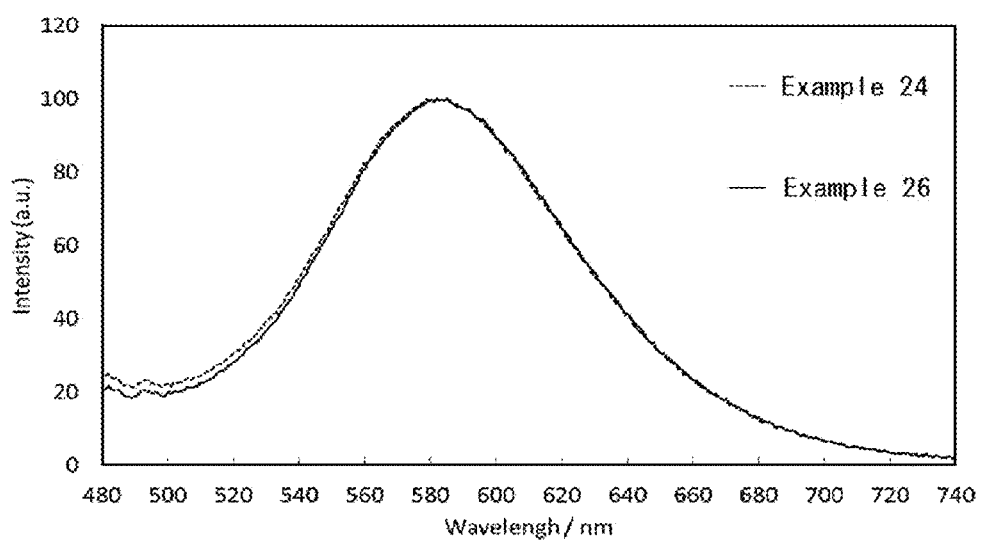
FIG. 16 is a graph depicting emission spectra of the phosphor acquired in Examples 24 and 26.

FIG. 16 shows the emission spectrum of each phosphor of Examples 24 and 26 when the phosphors were excited by light having a 455 nm wavelength, and Table 24 shows the emission peak wavelength, the chromaticity and the half-bandwidth of Examples 24 to 26.

TABLE 24

| | Emission peak wavelength (nm) | CIE x | CIE y | Half-bandwidth (nm) |
|---|---|---|---|---|
| Example 24 | 581 | 0.481 | 0.492 | 92 |
| Example 25 | 583 | 0.484 | 0.490 | 91 |
| Example 26 | 585 | 0.487 | 0.489 | 91 |

Example 27

The phosphor of Example 27 was acquired by synthesizing in the same manner as Example 2, except that "the holding at 2080° C. for 8 hours" was changed to "the removing and crushing the phosphor after holding at 1950° C. for 4 hours, and the holding at 2030° C. for 4 hours again".

As a result of performing the powder X-ray diffraction measurement (XRD) on the phosphor of Example 27, the same crystal phase as Example 1 was acquired.

Table 25 shows the emission peak wavelength, the chromaticity and the half-bandwidth when the phosphor of Example 27 is excited by light having a 455 nm wavelength. The internal quantum efficiency was 63%, the absorption efficiency was 86%, and the external quantum efficiency was 54%.

TABLE 25

| | Emission peak wavelength (nm) | CIE x | CIE y | Half-bandwidth (nm) |
|---|---|---|---|---|
| Example 27 | 584 | 0.500 | 0.486 | 91 |

<Manufacturing of Light-Emitting Device>

Example 28 and 29

First the phosphor-containing composition was adjusted.

Dimethyl-based silicon resin (100 parts by weight), fumed silica (5 parts by weight), green phosphor BG-601/E (made by Mitsubishi Chemical Corporation) (9 parts by weight) and the phosphor acquired in Example 7 or 13 (25 parts by weight) were mixed by an agitation defoaming apparatus to prepare the phosphor-containing composition. The quantity ratio of each composition was adjusted so that the chromaticity of the emission spectrum indicated by the later mentioned light-emitting device becomes close to CIEx=0.437 and CIEy=0.404.

Then the light-emitting device was manufactured using the phosphor-containing composition prepared above.

Using a manual pipette, the phosphor-containing composition acquired above is poured in a 5050 sized (5 mm²) ceramic package, on which a 35 mil InGaN blue LED is mounted. Then this light-emitting device was held at 100° C. for one hour, and then held at 150° C. for 5 hours so as to harden the phosphor-containing composition, whereby the light-emitting device was acquired. For the acquired light-emitting device, durability was evaluated by performing the following lighting test.

[Lighting Test]

A 350 mA current is supplied to the light-emitting device, and the emission spectrum was measured using a spectrometry device, which includes an integrating sphere.

Then a 150 mA drive current was continuously supplied to the semiconductor light-emitting device in a thermostat chamber which is set to 85° C., and the semiconductor light-emitting device was removed from the thermostat chamber at 200 hours, 500 hours and 1000 hours from the start of supplying current, and the emission spectrum was measured at each point in the same manner as time 0.

The durability of the phosphors of Examples 7 and 13 was evaluated based on the difference ($\Delta x$) between the chromaticity coordinate x calculated by the emission spectrum acquired at each timing of elapsed time, and the chromaticity coordinate x at time 0.

Table 26 shows this result.

TABLE 26

| | Phosphor | $\Delta x$ | | |
| --- | --- | --- | --- | --- |
| | | 200 hours | 500 hours | 1000 hours |
| Example 28 | Example 7 | −0.0012 | −0.0016 | −0.0010 |
| Example 29 | Example 13 | −0.0021 | −0.0027 | −0.0023 |

As shown in Table 26, $\Delta x$ of the light-emitting device using the phosphor of the present invention is very small. In other words, the light-emitting device using the phosphor of the present invention has superb durability.

As described above, the phosphor according to the present invention allows providing not only a bright light-emitting device which has good color reproducibility, but also a light-emitting device which has a strong emission intensity, even in regions where the operating temperature normally becomes high and the emission intensity drops.

In other words, the light-emitting device which includes the phosphor according to the present invention, and the illumination device and the image display device which includes the light-emitting device are high quality.

While the invention has been described in detail and with reference to specific embodiments thereof, it will be apparent to one skilled in the art that various changes and modifications can be made therein without departing from the spirit and scope thereof.

What is claimed is:

1. A phosphor comprising a crystalline phase having a composition expressed by Formula [1] below, a crystal system of the phosphor being a hexagonal crystal system, $$M_m A_a Al_b Si_c N_{40} \quad [1]$$

(in Formula [1]

M denoted an activating element,

A denotes one or more types of elements selected from the group consisting of alkaline earth metal elements, and m, a, b and c denote values that satisfy expressions below independent from each other $0 < m \leq 0.2$ $1.2 \leq a \leq 5.6$ $2.4 \leq b \leq 11.2$ $18.8 \leq c \leq 27.6$).

2. A phosphor comprising a crystalline phase including elements M, A, Al, Si and N, a space group of the phosphor being P-6

(where M denotes an activating element, and

A denotes one or more types of elements selected from the group consisting of alkaline earth metal elements).

3. The phosphor according to claim 1, wherein A includes Ca and/or Sr.

4. The phosphor according to claim 1, wherein M includes Eu.

5. The phosphor according to claim 1, wherein the phosphor has an emission peak wavelength in a range of 560 nm or more and 620 nm or less when irradiated with an excitation light having a wavelength of 350 nm or more and 450 nm or less.

6. A light-emitting device, comprising a first illuminant, and a second illuminant that emits visible light when irradiated with light from the first illuminant, wherein the second illuminant includes the phosphor according to claim 1.

7. An illumination device comprising the light-emitting device according to claim 6 as a light source.

8. An image display device comprising the light-emitting device according to claim 6 as a light source.

* * * * *